(12) United States Patent
Bodnar et al.

(10) Patent No.: US 10,505,561 B2
(45) Date of Patent: Dec. 10, 2019

(54) METHOD OF APPLYING A DITHER, AND ANALOG TO DIGITAL CONVERTER OPERATING IN ACCORDANCE WITH THE METHOD

(71) Applicant: Analog Devices Global Unlimited Company, Hamilton (BM)

(72) Inventors: Rares Bodnar, Reading (GB); Asif Ahmad, Newbury (GB); Christopher Peter Hurrell, Cookham (GB)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/052,890

(22) Filed: Aug. 2, 2018

(65) Prior Publication Data

US 2019/0280706 A1     Sep. 12, 2019

Related U.S. Application Data

(63) Continuation-in-part of application No. 15/916,009, filed on Mar. 8, 2018.

(51) Int. Cl.
*H03M 1/66* (2006.01)
*H03M 1/34* (2006.01)
(Continued)

(52) U.S. Cl.
CPC ............ *H03M 1/345* (2013.01); *H03M 1/165* (2013.01); *H03M 1/201* (2013.01)

(58) Field of Classification Search
CPC ...... H03M 1/345; H03M 1/201; H03M 1/165; H03M 1/66; H03M 1/747; H03M 1/12; H03M 1/00
(Continued)

(56) References Cited

U.S. PATENT DOCUMENTS 4,499,594 A    2/1985   Lewinter
4,546,343 A    10/1985  Higgins et al.
(Continued)

FOREIGN PATENT DOCUMENTS

CN     105811984      7/2016
WO     2010/048083    4/2010
(Continued)

OTHER PUBLICATIONS

Yong Lim et al., *A 1 mW 71.5 dB SNDR 50 Ms/s 13 bit Fully Differential Ring Amplifier Based SAR-Assisted Pipeline ADC*, IEEE Journal of Solid-State Circuits, vol. 50, No. 12, Dec. 2015, 11 pages.
(Continued)

*Primary Examiner* — Jean B Jeanglaude
(74) *Attorney, Agent, or Firm* — Patent Capital Group

(57) ABSTRACT

A dither is an uncorrelated signal, usually pseudo-random noise injected into the input of an ADC such that a given input value of the wanted signal becomes spread over a plurality of codes. This reduces the effect of DNL and also smooths the integral non-linearity (INL) response of the ADC. The advantages of introducing dither could be obtained without having to perturb the signal input to the ADC. This avoids the introduction of additional components in the ADC. The dither can be applied to the components used to form a residue of the ADC stage within a pipelined converter. For example, a dither can be applied solely to a DAC part or different dithers can be applied to a ADC and DAC parts respectively. This allows greater flexibility of linearization of the ADC response and the formation of an analog residue by the DAC.

24 Claims, 21 Drawing Sheets

(51) Int. Cl.
*H03M 1/16* (2006.01)
*H03M 1/20* (2006.01)

(58) Field of Classification Search
USPC .......................................... 341/143, 155, 144
See application file for complete search history.

(56) References Cited

U.S. PATENT DOCUMENTS

| | | | |
|---|---|---|---|
| 5,041,831 A | 8/1991 | Bohley et al. | |
| 5,493,298 A * | 2/1996 | Bartz | H03M 1/0641 341/118 |
| 5,600,322 A | 2/1997 | Garavan | |
| 5,621,409 A | 4/1997 | Cotter et al. | |
| 6,154,160 A | 11/2000 | Meyer et al. | |
| 6,172,629 B1 * | 1/2001 | Fetterman | H03M 1/0641 341/131 |
| 6,404,364 B1 * | 6/2002 | Fetterman | H03M 1/0641 341/131 |
| 6,507,304 B1 | 1/2003 | Lorenz | |
| 6,556,158 B2 * | 4/2003 | Steensgaard-Madsen | H03M 1/145 341/131 |
| 6,657,570 B1 | 12/2003 | Chiappetta | |
| 6,734,818 B2 * | 5/2004 | Galton | H03M 1/0673 341/118 |
| 6,784,814 B1 * | 8/2004 | Nair | H03M 1/0641 341/118 |
| 6,828,927 B1 | 12/2004 | Hurrell et al. | |
| 6,970,120 B1 * | 11/2005 | Bjornsen | H03M 3/38 341/118 |
| 7,015,853 B1 | 3/2006 | Wolff et al. | |
| 7,148,834 B2 | 12/2006 | Da Fonte | |
| 7,158,070 B1 | 1/2007 | Yang et al. | |
| 7,348,906 B2 * | 3/2008 | O'Donnell | H03M 1/0641 341/131 |
| 7,602,324 B1 * | 10/2009 | Huang | H03M 1/0641 341/131 |
| 7,663,518 B2 | 2/2010 | Hurrell | |
| 7,710,300 B2 | 5/2010 | Kwan | |
| 7,944,378 B1 | 5/2011 | Pesenti | |
| 8,213,703 B2 | 7/2012 | Inoue et al. | |
| 8,451,160 B1 | 5/2013 | Zhou et al. | |
| 8,618,975 B2 | 12/2013 | Nys et al. | |
| 8,730,073 B1 | 5/2014 | Wang et al. | |
| 8,766,839 B2 | 7/2014 | Janakiraman et al. | |
| 8,907,833 B1 | 12/2014 | Zhou et al. | |
| 9,054,727 B2 * | 6/2015 | Steensgaard-Madsen | H03M 1/0668 |
| 9,214,953 B1 | 12/2015 | Mengad | |
| 9,331,709 B2 | 5/2016 | Steensgaard-Madsen | |
| 9,413,381 B2 | 8/2016 | Vasani et al. | |
| 9,735,799 B1 | 8/2017 | Nguyen | |
| 9,748,966 B2 * | 8/2017 | Nagarajan | H03M 1/0641 |
| 9,825,643 B1 | 11/2017 | Taylor et al. | |
| 2006/0022854 A1 * | 2/2006 | Bjomsen; Johnny | H03M 1/0641 341/120 |
| 2006/0114144 A1 | 6/2006 | Lyden et al. | |
| 2010/0283641 A1 * | 11/2010 | Huang | H03M 1/0639 341/118 |
| 2013/0120174 A1 | 5/2013 | Ali | |
| 2013/0278453 A1 * | 10/2013 | Steensgaard-Madsen | H03M 1/0668 341/110 |

FOREIGN PATENT DOCUMENTS

| | | |
|---|---|---|
| WO | 2010/144205 | 12/2010 |
| WO | 2013/142463 | 9/2013 |

OTHER PUBLICATIONS

*AN-804 Improving A/D Converter Performance Using Dither*, Texas Instruments, Literature No. SNOA232, © 2011, 10 pages.
Brad Brannon, *Overcoming Converter Nonlinearities with Dither*, AN-140 Application Note, Analog Devices, Dec. 1995, 8 pages.
Ex Parte Quayle Office Action issued in U.S. Appl. 16/916,009 dated Dec. 14, 2018.
Lee et al., A SAR-Assisted Two-Stage Pipeline ADC, IEEE Journal of Solid-State Circuits, vol. 46, No. 4, Apr. 2011, 11 pages.
English Translation of Foreign Reference CN105811984, 10 pages. (see 2 above).
Partial Search Report issued in PCT/EP2019/055852 dated Jun. 17, 2019, 18 pages.
Ex-Parte Quayle Office Action issued in U.S. Appl. No. 16/053,455 dated Apr. 9, 2019, 12 pages.
Restriction Requirement issued in U.S. Appl. No. 15/916,009 dated Oct. 12, 18, 6 pages.
Ex Parte Quayle Office Action issued in U.S. Appl. 15/916,009 mailed Dec. 14, 2018.
Final Rejection issued in U.S. Appl. No. 16/916,009 dated Mar. 11, 2019.
Verbruggen et al., A 2.5 mW 11b 410 MS/s Dynamic Pipelined SAR ADC with Background Calibration in 28nm Digital CMOS, 2013 Symposium on VLSI Circuits Digest of Technical Papers, 2 pages.
Office Action issued in EP Patent Application No. 19161602.8 dated Aug. 13, 2019, 12 pages.
Ke et al., A 14-bit 100 MS/s SHA-less pipelined ADC with 89 dB SFDR and 74.5 dB SNR, IEICE Electronics Express, vol. 12, No. 5, ©2015, 11 pages.

* cited by examiner

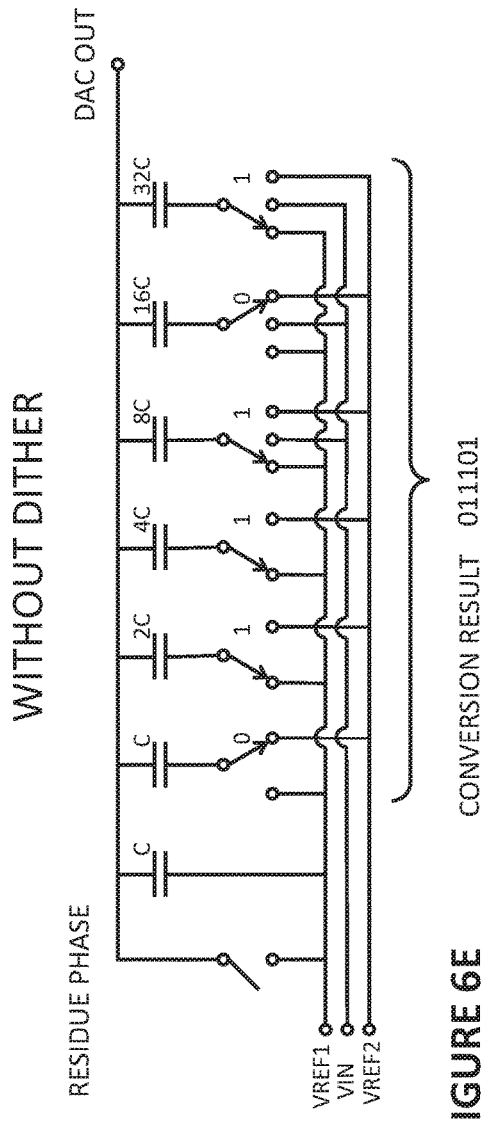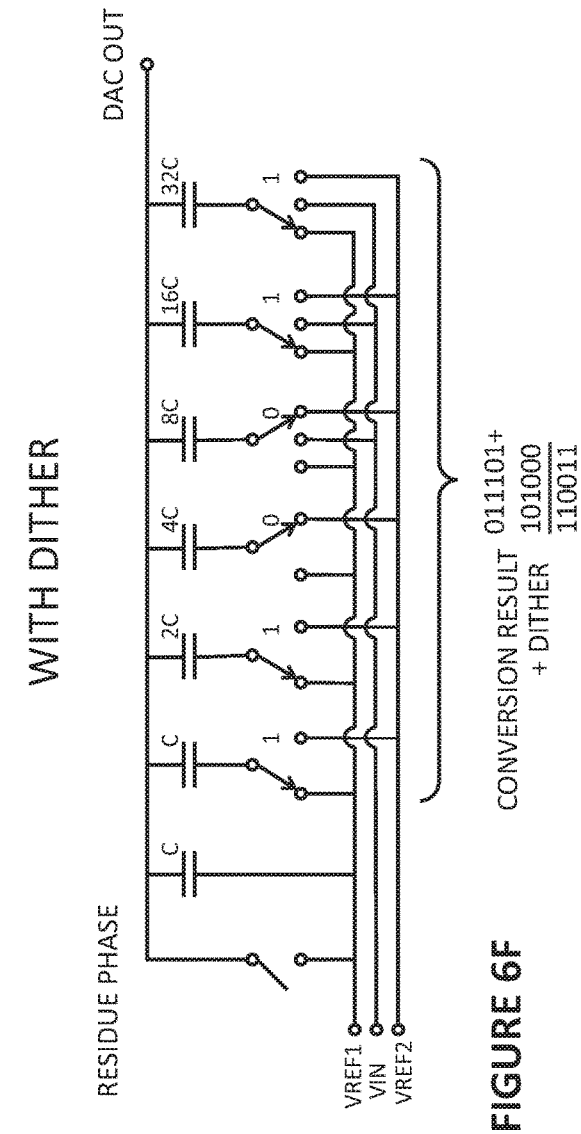

METHOD OF APPLYING A DITHER, AND ANALOG TO DIGITAL CONVERTER OPERATING IN ACCORDANCE WITH THE METHOD

PRIORITY DATA

This application claims priority to U.S. application Ser. No. 15/916,009, titled "ANALOG TO DIGITAL CONVERTER STAGE", which is hereby incorporated by reference in its entirety.

TECHNICAL FIELD OF THE DISCLOSURE

The present disclosure relates to improvements in analog to digital converters.

BACKGROUND

Analog to digital converters, ADCs, are used to convert signals from the real world to the digital domain, the signals being obtained from, for example, cameras, microphones, temperature sensors, pressure sensors, position transducers, gas-flow sensors, electro-chemical cells (e.g., for blood glucose monitoring), and many other forms of transducer. Those real world measurements are converted into digital values that can be processed by computers, micro-processors, and the like.

Parameters of ADCs include how fast they are, how finely they can distinguish changes in the input signal (i.e., their resolution), and how linear they are. Ideally, all single bit transitions in the output word of an ADC would equate to a fixed size transition in the analog input signal presented to the ADC. In reality, this is very hard to achieve.

Non-linearity in an analog to digital converter can be improved by dithering the ADC. In effect, a non-linearity is smeared out over several digital codes of the ADC by the application of the dither, thereby reducing the severity of the non-linearity at any given ADC output code. The dither value can then be subtracted such that the digital value of the ADC output signal (the conversion result) is not affected by the dither, but the performance of the ADC is improved.

As noted above, speed is one of the parameters of the ADC. To increase the conversion rate, the task of converting a signal may be shared between two or more series connected stages. Such an arrangement is known as a pipeline. A stage of a pipeline performs part of the analog to digital conversion. A stage may also form a residue, which represents a difference between the analog signal the stage received and the analog value equivalent to digital conversion result of the stage. The residue is passed to a subsequent stage of the pipeline. The subsequent stage performs an analog to digital conversion of the residue.

BRIEF DESCRIPTION OF SOME OF THE EMBODIMENTS OF THE DISCLOSURE

According to a first aspect of this disclosure, there is provided a method of operating a residue forming stage of an analog to digital converter. Residue forming stages are often found in pipelined analog to digital converters. The residue forming stage of this disclosure comprises an analog to digital converter and at least a first sampling digital to analog converter (DAC). The analog to digital converter of the residue forming stage has a least significant bit value, representing the limit of resolution of the stage. The method comprises receiving an input signal to be converted and adding a first dither value to the input signal to form a dithered input signal which is sampled by the at least first sampling digital to analog converter. However, the first dither value is not added to the input signal provided to the analog to digital converter of the stage. As an alternative, a different dither, i.e., a second dither value can be applied to the signal provided to the analog to digital converter. The method further comprises using the analog to digital converter of the stage to form a digital code representing the input signal and removing at least part of the first dither. The removing of at least part of the first dither may be performed by: (a) modifying the digital code by a digital value representative of or based on at least part of the first dither value to form a modified digital code, and providing the modified digital code to the at least one sampling digital to analog converter; and/or (b) passing at least part of the dither to a subsequent analog to digital converter stage that it receives a residue from the sampling digital to analog converter, the dither being subtracted from a digital output result of the subsequent analog to digital converter stage.

It is thus possible to apply a dither to the conversion result without having to modify the input signal that is sampled or converted by the analog to digital converter of the stage. The analog to digital converter of the stage may include an ADC operated in accordance with a suitable conversion strategy, such as (but not limited to) a successive approximation register (SAR) conversion scheme. Other technologies may, for example, include Flash converters, ramp converters, and sigma-delta converters.

The ADC of the stage may be a combination of ADC technologies, such as a Flash ADC to quickly resolve a few of the most significant bits of the input signal, and to provide a partial result to a further converter technology that resolves the rest of the conversion result output by the stage. Alternatively, the ADC of the stage could be formed of a single technology such as a Flash converter or a sigma-delta converter.

The sampling DAC may be formed as a combination of a sampling circuit including a sampling capacitor and associated switches for performing a sample and hold or track and hold function, and a cooperating DAC. The sampling circuit and the DAC are coupled together such that a difference can be formed between an analog value sampled onto the sampling circuit and a DAC output value corresponding to the analog equivalent of a digital word supplied to the DAC. The cooperating DAC, or a further DAC, may be used to apply a dither signal to the sampled value.

Advantageously, a switched capacitor DAC architecture is used form the sampling DAC. Such an arrangement allows the switched capacitor DAC to act as the sampling circuit. Additionally by modifying the connection state of some of the DAC capacitors during a sampling phase, or after sampling, the switched capacitor DAC can apply a dither to the sampled signal or to the residue.

The capacitance of the sampling circuit, or of the capacitors within the switched capacitor DAC, can be selected based on a desired noise performance.

The sampling DAC may be formed from a plurality of cooperating DACs. The DACs may be different, in terms or relative sizes or implementing technologies.

Preferably, the sampling DAC may be formed of a plurality of slices, each slice being an individual DAC which is substantially the same as each other slice. In this context the slices have matched sampling performances. The DAC within the ADC may formed of one of the DAC slices.

It can be seen that a repeatable DAC element may be used to form the sampling DAC and the ADC of the stage. By using a plurality of slices in the DAC and the ADC each of the ADC and the DAC can have matched sampling and timing characteristics. The individual slices in the DAC can be operated in a co-operative manner to reduce the thermal noise of the DAC.

According to a second aspect of this disclosure there is provided a stage of an ADC. The stage comprises an ADC, a DAC, and a dither generator for generating a first dither. The ADC is arranged to receive an analog input signal. For example, the ADC is arranged to sample the input signal in a sampling phase and subsequently in a conversion phase to form a digital conversion value representing the analog input signal. Substantially simultaneously with the sampling phase of the ADC, the DAC is arranged to sample a combination of the analog input signal and the first dither. The DAC is further arranged to receive a digital conversion value from which the value of the first dither has been subtracted, or which has been modified in a known way taking account of the value of the first dither, to form an analog residue representing a difference between the digital conversion value and the analog input signal.

The stage of the ADC thus has a dither applied to the DAC portion thereof. This can avoid the need to apply a dither to the ADC of the stage, or the dither magnitude can be reduced or be less than a LSB (Least Significant Bit) size. This avoids a reduction in the dynamic range of the ADC as a result of applying the dither. In some embodiments a dither can be applied to the ADC or a small dither can be left in or introduced to the residue so as to linearize the response of the residue amplifier or the response of a subsequent converter.

According to a third aspect of the present disclosure, there are provided first and second stages of an analog to digital converter, the first and second stages being physically or temporally in series such that an analog residue output from the first stage is an input of the second stage. The first stage comprises a first stage analog to digital converter arranged to receive an input signal. The first stage also comprises a sampling digital to analog converter arranged to receive and sample the input signal. The second stage comprise a second stage analog to digital converter arranged to receive an output of the sampling digital to analog converter, either directly or after amplification. The first and second stages are further responsive to a dither generator, the dither generator causing a dither to be applied to the input signal, either prior to, concurrent with, or after sampling of the input signal by the sampling digital to analog converter and/or by the first stage analog to digital converter, and the second stage includes a digital subtractor to subtract the dither value from an output of the second stage analog to digital converter.

According to a further aspect of the present disclosure there is provided a method of operating a pipelined ADC, the method comprising applying a dither to a residue formed by an Nth stage of the ADC, such that the dither modifies an input signal to an N+1th stage of the ADC. N is an integer number greater than zero.

The dither may be greater or smaller than the least significant bit value of the Nth stage. The digital value of the dither is passed to the N+1th stage of the ADC such that the value of the dither can be removed from the output result of the N+1th stage. There is also provided a pipelined ADC arranged to work in accordance with the above method.

BRIEF DESCRIPTION OF THE DRAWINGS

To provide a more complete understanding of the present disclosure and features and advantages thereof, reference is made to the following description, taken in conjunction with the accompanying Figures, wherein like reference numerals represent like parts, in which:

FIGS. 6A-F compare the operation of the sampling DAC without a dither being applied and with a dither being applied;

DESCRIPTION OF SOME EMBODIMENTS OF THE DISCLOSURE

Figure 1:
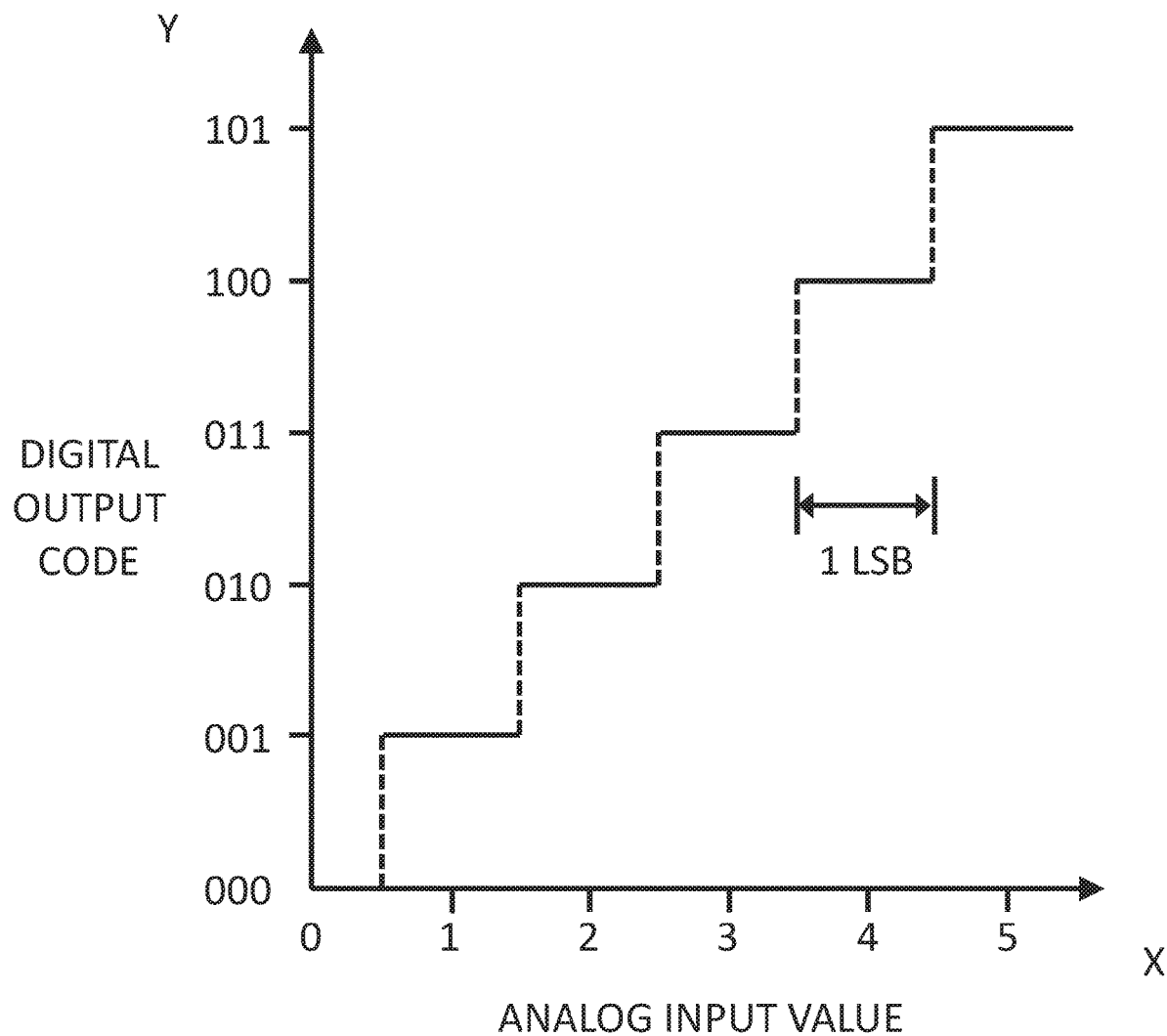
FIG. 1 is a graph showing the relationship between the analog value at the input of an analog to digital converter and the digital code output by the ADC for an ideal ADC.

Ideally, an analog to digital converter would be completely linear, such that the same difference in value between one digital code and the next digital code always corresponded to exactly the same size change in an input signal, Vin(t). Such an idealized example is shown in FIG. 1 where the analog input value, expressed in arbitrary units is indicated along the X axis of FIG. 1 and a corresponding digital output code is shown on the Y axis. In order to minimize quantization error, the analog input value should be mapped to the nearest digital code. As an example an input value Vin(t)=2.449 maps to output code 010 or 2, whereas an input value of 2.501 maps to the output code 011 or 3.

Figure 2:
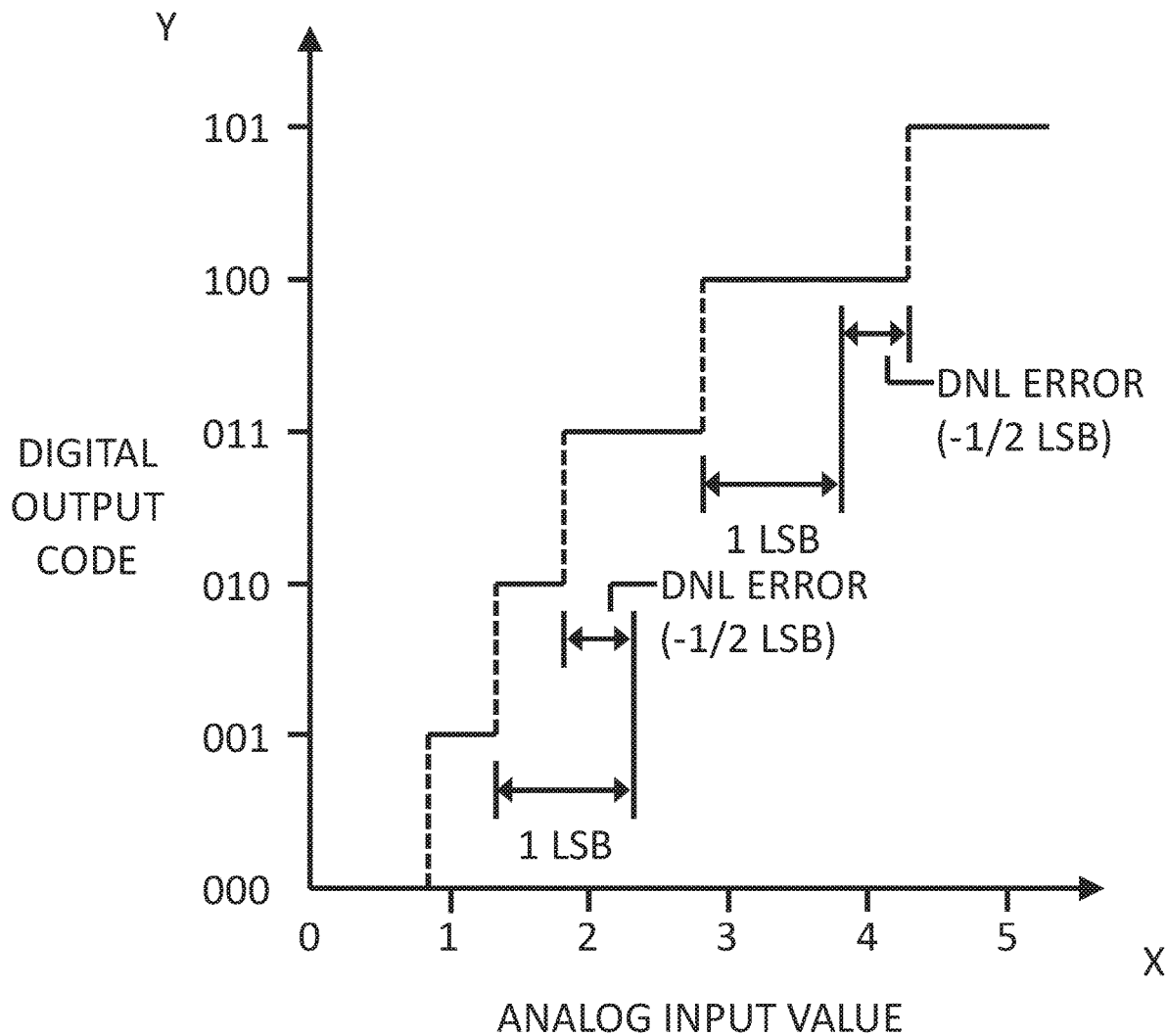
FIG. 2 is a graph showing the relationship between the analog value at the input of an analog to digital converter and the digital code output by the ADC for an ADC having differential non-linearity (DNL) errors.

However, in reality, imperfections in the ADC, for example due to lithography errors, aging, stress, or thermal gradients can cause the distance between digital boundaries to vary, resulting in an error known as DNL error. FIG. 2 shows an exaggerated instance of DNL error where the transition between codes 000 and 001 has moved from Vin(t)=0.5 to Vin(t)=0.75 and the transition from codes 001 to 002 has moved from Vin(t)=1.5 to Vin(t)=1.25. As a consequence code 001 no longer spans an input size of 1 least significant bit, but instead has a range corresponding to 0.5 LSB. It exhibits a DNL error of −0.5 LSB. Similarly code 100 has expanded such that transitions between it and adjacent codes occur at Vin(t)=3 and Vin(t)=4.5. This code extends over a range of 1.5 LSB has a DNL error of 0.5.

For differential ADC converters, DNL errors at the very edges of the converter input range are relatively less troublesome than DNL errors in the middle of the range as signal values at the edges are less likely to be exercised than codes near the middle of the dynamic range if clipping is avoided. That said, the probability of the input signal having a given value also affects the importance of a DNL error associated with an output code. To see this, consider a sinusoidal input signal. The rate of change of the signal is fast about its midpoint and slow about its peaks and troughs. It can intuitively be seem that DNL errors occurring for a first code value when the signal is only slowly changing are going to be output with a greater probability than an error occurring for a second code where the signal is quickly changing as there is a reduced probability of the signal being sampled to the second code. For single ended ADCs, DNL errors at the beginning of the conversion range are more significant because their size relative to the small input signal makes them proportionately more significant.

These problems have been recognized by workers in this field.

An answer to this problem is to introduce a dither. A dither is an uncorrelated signal, usually pseudo-random noise injected into the input of an ADC such that a given input value V1 of the wanted signal Vin(t) becomes spread over a plurality of codes. This reduces the effect of DNL and also smooths the integral non-linearity (INL) response of the ADC.

Figure 3:
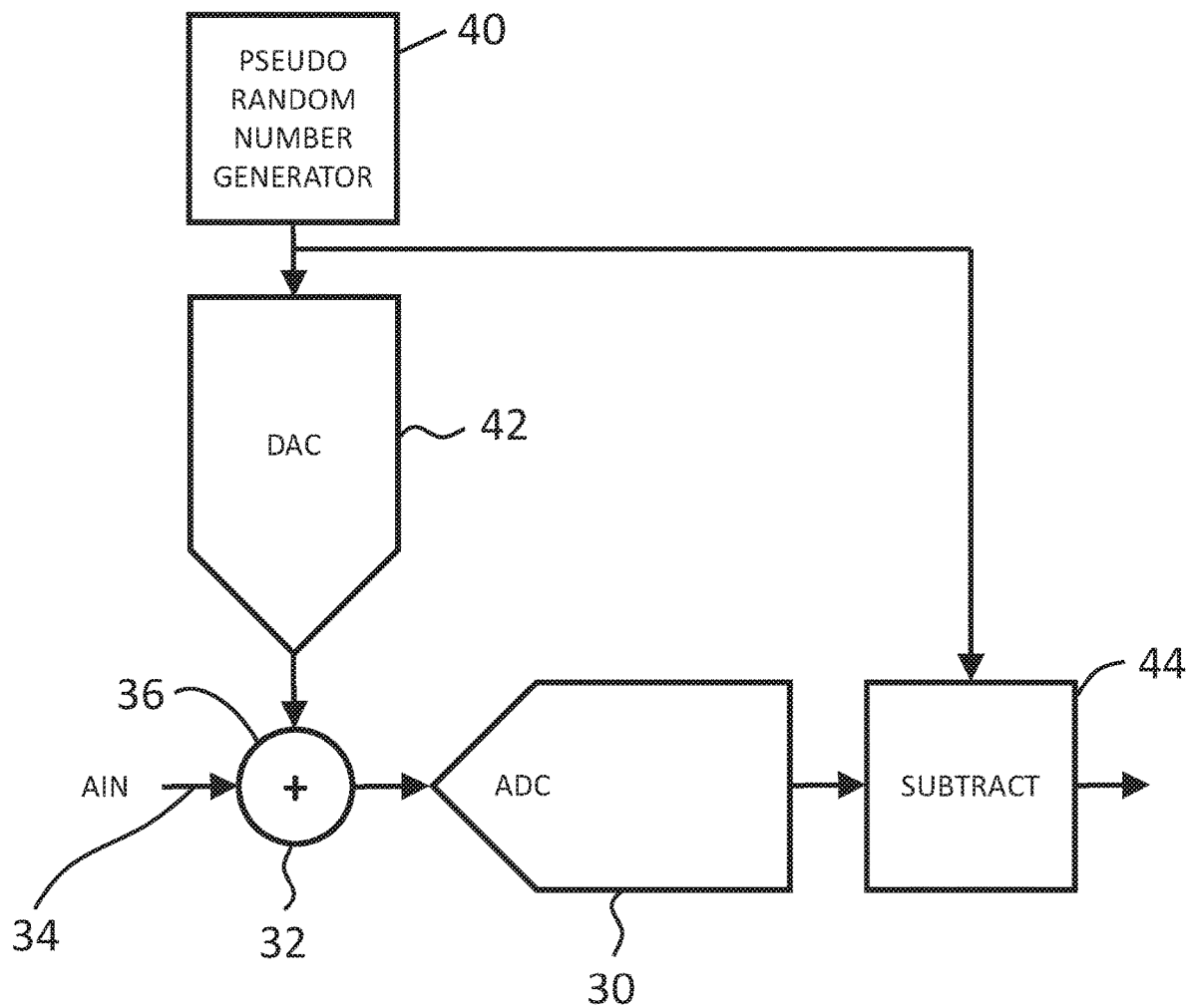
FIG. 3 is a schematic diagram of an ADC having dither applied thereto in order to reduce the effect of DNL errors.

An exemplary circuit for introducing dither is shown in FIG. 3. An ADC 30 is preceded by a summer 32 which accepts the input signal to be digitized, Ain, at a first input 34 and a dither signal at a second input 36. The dither signal is formed in the digital domain by a pseudo-random number generator 40. A digital output of the pseudo-random number generator is provided to a DAC 42 and a digital subtractor "SUBTRACT" 44. The dither is converted to an analog signal by the DAC 42 and added to the input signal Ain by the summer 32. The ADC 30 then converts the input signal that it receives, said input signal comprising the sum of Ain and the dither, and outputs a digital word. With appropriate scaling the value of the analog dither added to the input signal can be subtracted in the digital domain by the subtractor 44, to yield the digital version of the input signal.

To avoid the problems of scaling between the DAC 42 and the ADC 30, the DAC can be formed from part of a switched capacitor array inside the ADC. For instance, a switched capacitor array can act as a sampling DAC inside an ADC comprises N capacitors. The array of N capacitors is notionally split into a first group of N-K capacitors and a second group of K capacitors. During sampling of the input signal, the input Vin(t) is sampled onto the capacitors within the first group. Following the sampling, the capacitors of the second group are set in accordance with a dither word generated by a pseudo-random noise generator. This has an advantage of automatically ensuring scaling between the added signal and the ADC output as the same DAC performs both tasks. Care must be taken to ensure that the dynamic range of the ADC in not exceeded as the sum of the input signal and the dither must remain within the dynamic range of the ADC if clipping is to be avoided.

The inventors realized that the advantages of introducing dither could be obtained without having to perturb the signal input to the ADC. This avoids the introduction of additional components in the ADC. The dither can be applied to the components used to form a residue of the ADC stage within a pipelined converter. Not only can this approach simplify the design of the ADC, but it also allows the ADC section to be selected for considerations such as speed and resolution, whereas the residue forming section can be selected using a differing sets of considerations, such as noise performance.

Figure 4:
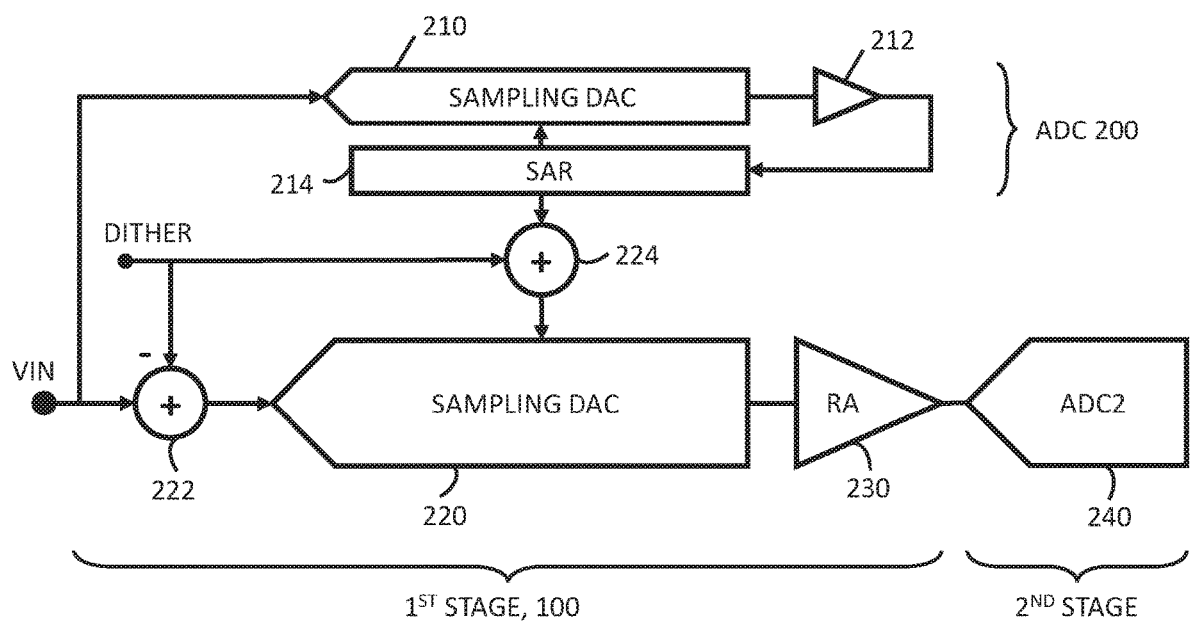
FIG. 4 is a schematic diagram of an ADC stage in accordance with the teachings of this disclosure.

FIG. 4 shows an ADC stage 100 constituting an embodiment of the present disclosure. This example focuses on the first stage of a pipelined ADC, although equally the stage need not be the first stage. An ADC part 200 is arranged to receive an input signal and, in use, to form a digital representation of the input signal. In FIG. 4, the ADC 200 is formed of a sampling DAC 210, a comparator 212, and a SAR logic 214 which uses the sampling DAC 210 to sample the input signal and to convert it into a digital equivalent using the a suitable SAR conversion scheme. The ADC part 200, which can be regarded as a "stage ADC", is associated with a separate residue forming stage comprising a further sampling DAC 220.

A dither generator (not shown, but may be a pseudo-random number generator 40 as described with respect to FIG. 3) is provided in association with a sampling DAC 220. The dither generated by the dither generator, which can be regarded as a first dither, could be applied in the analog domain as described with respect to FIG. 3 by using an explicit DAC 42 to form an analog value which is then applied to a summer 222 so as to modify the analog value VIN sampled onto the sampling DAC 220. However, a preferred approach, as will be described in more detail with respect to FIGS. 6A-F, is to modify the status of some of the elements, such as capacitors, within the sampling DAC in response to the digital representation of the dither value during sampling of input signal VIN. This causes the dither to be applied to the sampled value of VIN by the sampling DAC 220 itself. For the purposes of explaining the operation of the present disclosure a summer 222 is indicated to represent the application of the dither value to VIN, even if the dither is summed internally of the sampling DAC.

In use, the ADC part 200 and the sampling DAC 220 can be instructed to sample VIN at the same instant. Following sampling, the ADC part 200 converts the sampled input signal. When the ADC 200 has formed a digital representation of the input signal, this is provided to the sampling DAC 220. A summer 224, or other code modification circuit, is used to take the digital output of the ADC 200 and supply a modified version of it to the sampling DAC 220 as an input word to be converted. In this example, the summer 224 is used to subtract the dither value from the digital word provided by the ADC part 200. Although the digital output of the ADC part 200 is not dithered, the value of the residue formed by the sampling DAC 220 is dithered, and as the residue is passed to a subsequent stage of the pipeline, this introduces a dither in the final digital output of the pipelined analog to digital converter.

Setting the dither during the sampling instant and then removing it by subtracting the dither value from the digital word provided to set the DAC 220 has the advantage of not burdening the residue amplifier 230 with having to accept an increased dynamic range. However, if the residue amplifier has sufficient input range, then some or all of the dither may be left in the output of the sampling DAC and passed to a subsequent stage.

The scheme described above works well when the dither is an "integer dither" that is to say the dither is nominally formed in units of 1 LSB of the sampling DAC 210 within the ADC 200. In such a scheme however the dither is removed at the node formed at or before the input to the residue amplifier 230. The amplifier therefore only sees an input value which is a function of the residue. However, if a fractional dither is also used in conjunction with the integer dither then the input to the residue amplifier also becomes dithered, and this effectively linearizes the residue amplifier.

Figure 5:
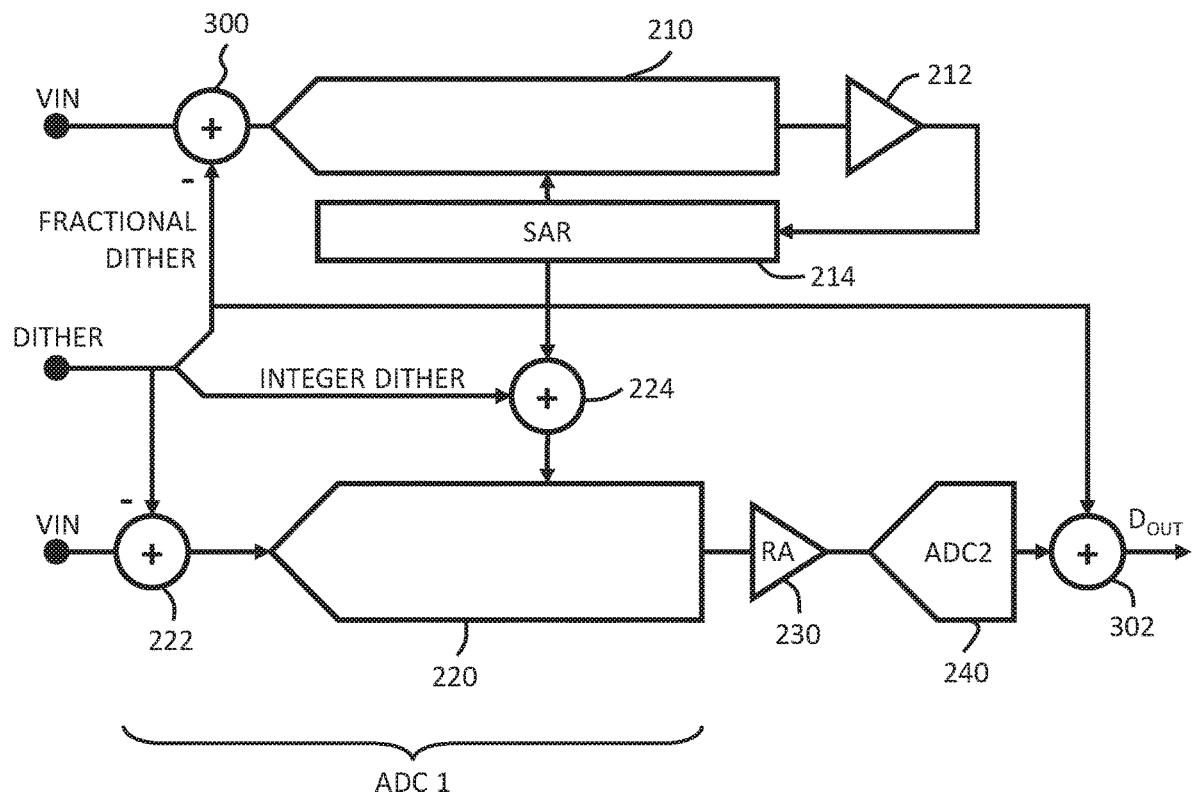
FIG. 5 is schematic diagram showing at a system level how the dither is added and removed again in a second embodiment of the present disclosure.

Such an arrangement is shown in FIG. 5. Here the first stage, ADC1, of a pipelined ADC can be considered as having a first stage LSB. The dither signal can then be formed as a digital word partitioned into two parts, a first dither part being an integer part and a second dither part being a fractional part. The integer part specifies the size of the dither in terms of integer numbers of the LSB of the first stage to which the dither is being applied. The fractional part specifies part of the dither as a fraction of the LSB of the first stage. This fractional dither may be expressed as an integer number of LSB of the second ADC 240, and may also include a fractional portion corresponding to less than one LSB of the second ADC 240.

In the arrangement shown in FIG. 5, the integer part of the dither is handled as was previously described with respect to FIG. 4. However the fractional part of the dither can be added to the signal sampled onto the sampling DAC 210. This is illustrated by the provision of a summer 300 in the analog signal path to the ADC part 200. This approach could be used, in conjunction with a DAC to provide a modified voltage, but in preference the fractional dither is applied by setting some additional dither capacitors provided as part of the sampling DAC 210 to provide a sub-LSB dither. Once the dither is added the ADC part 200 is used to perform its analog to digital conversion, and it outputs a digital output. It should be noted that the digital output is not processed in this example to remove any of the fractional dither that was added to the sampling DAC 210. Thus, the output by the SAR logic 214 may be modified from its un-dithered value and the words provided to the DAC 220 may be different as a result of the fractional dither being applied. Correction for the integer portion of the dither is performed as was described with respect to FIG. 4. The fractional dither becomes summed with the residue to create a dithered residue. This dithered residue is amplified by the residue amplifier 230 and passed to the second ADC 240. With proper scaling the fractional dither can be represented as a plurality of LSB of the second ADC 240, and hence the digital representation of the fractional dither can be subtracted from the digital output of the second ADC by a digital summer 302. This mitigates the effect of non-linearity within the residue amplifier or the second ADC 240. This approach can be extended to apply a dither to more than 2 stages of a pipelined ADC.

Figure 6A:
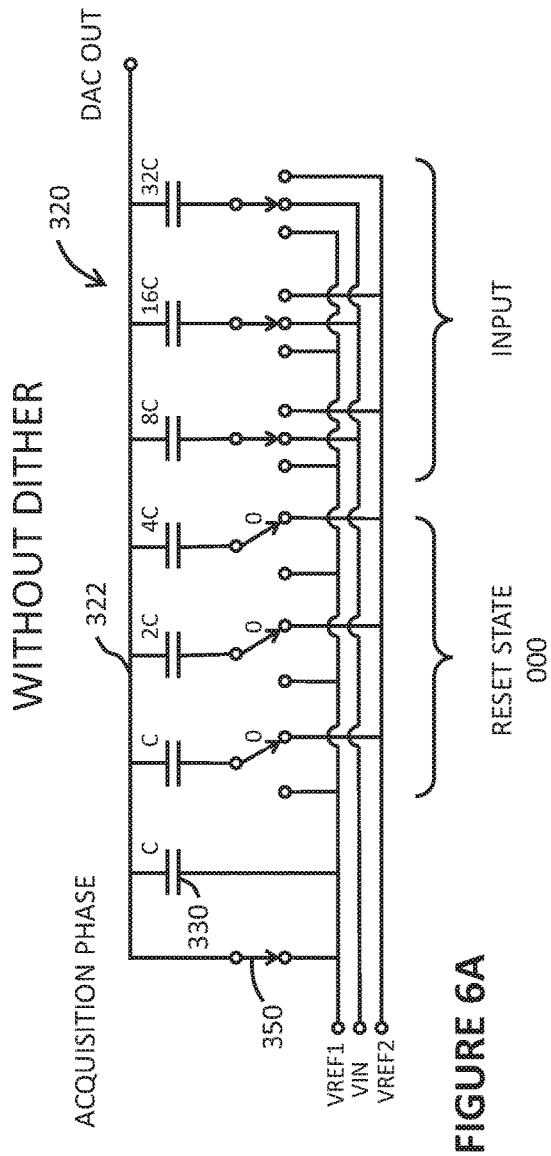
Figure 6B:
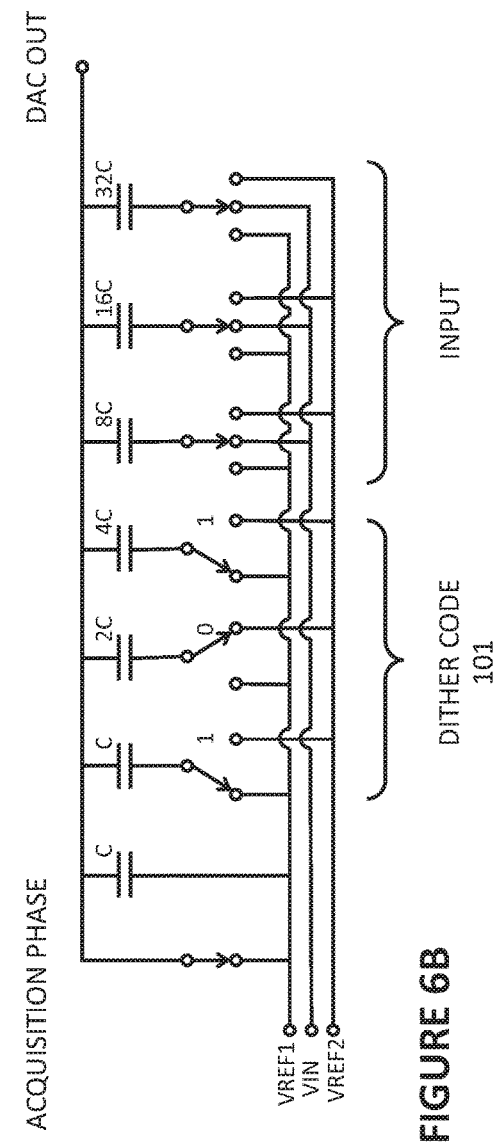

As noted above, the sampling DAC 220 can be used to apply the dither to the sampled value of the input signal. This will now be discussed with respect to FIGS. 6a to 6f. Each Figure shows 6 capacitors with respective weights C, 2C, 4C, 8C, 16C, and 32C within a switched capacitor sampling DAC 320. The top plates of the array of capacitors are further connected to a terminating capacitor 330 by way of a shared conductor 322. In this simplified arrangement, only the three most significant capacitors 8C, 16C and 32C can be connected to sample the input signal VIN during a sampling phase by connecting their lower plates (as shown) to VIN via respective switches. In a sampling DAC not applying dither, as shown in FIG. 6A, the capacitors C, 2C, and 4C are connected to VREF2 (e.g., ground) during the sampling phase. In contrast when a dither is applied, as shown in FIG. 6B, the lower three capacitors are connected to either VREF1 or VREF2 (e.g., ground or 0V) in accordance with a dither code. In FIG. 6B, the dither code is "101" (or "101000" for the entire array reading from least significant to most significant bit) resulting in the capacitors C and 4C being connected to VREF1 and the capacitor 2C being connected to VREF2. Sampling switch 350, when closed, connects a reference voltage (e.g., VREF1 or VREF2) to the shared conductor 322. Sampling switch 350 is opened to hold the sampled input value as per FIG. 6A, or the combination of the sampled input signal and the dither as per FIG. 6B.

Figure 6C:
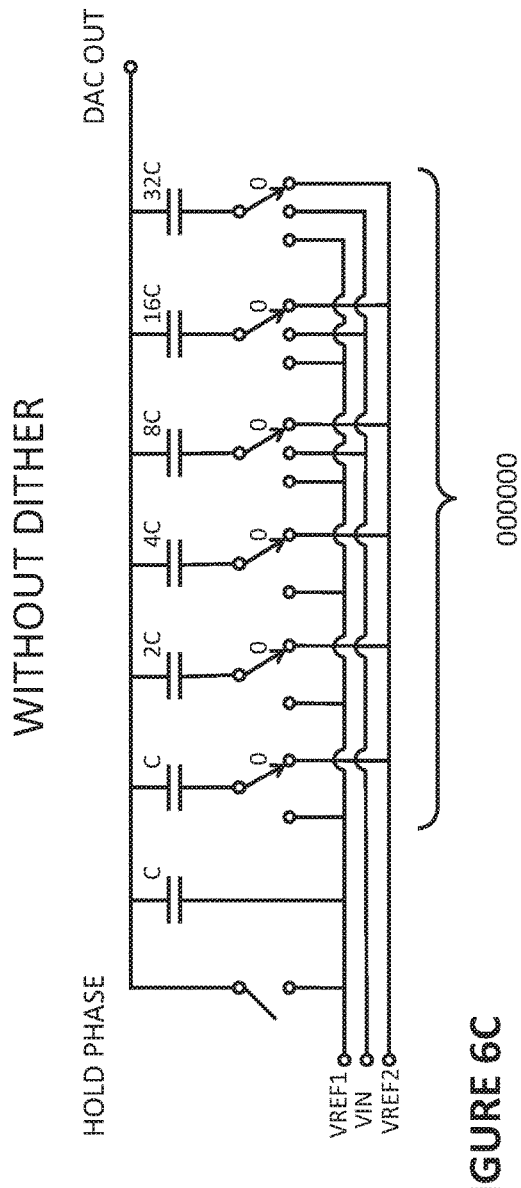
Figure 6D:
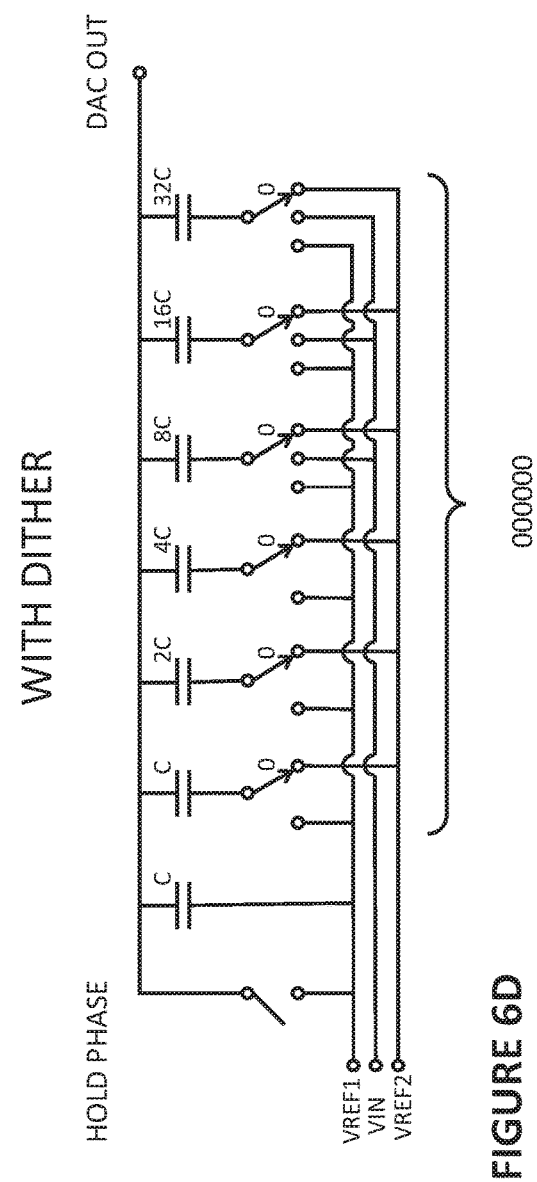

Once the input has been sampled, the sampling DAC can be set to a hold state, which is shown in FIG. 6C for the case without a dither, and FIG. 6D for the case with a dither. It can be seen that the hold states are the same, with all the capacitors being connected to VREF2 (e.g., ground).

Once the ADC part 200 has made its conversion, the digital word representing the conversion result, here "011101" is applied to the sampling DAC 220 so that it can form a residue. In the case without dither, as shown in FIG. 6E, the DAC 220 is set to "011101", i.e., the capacitors 2C, 4C, 8C, and 32C are connected to VREF1, whereas the other capacitors are connected to VREF2. In the case with dither, as shown in FIG. 6F, the dither value of 101000 is added to the converted value "011101" to form "110011" which is used to set the switch positions of the capacitors of the sampling DAC. The length of the sampling DAC is not restricted to six capacitors (assuming one capacitor per bit), and this number was chosen as a simple example, sampling DACs may have more or fewer "bits" of the designers will.

The inventors realized that the teachings herein could be modified by use of a Slice or Sliced architecture, to keep the dither accurately scaled with the digital output of the ADC and avoid any reduction in dynamic range, while also exhibiting increased rate of throughput within the ADC.

Figure 7:
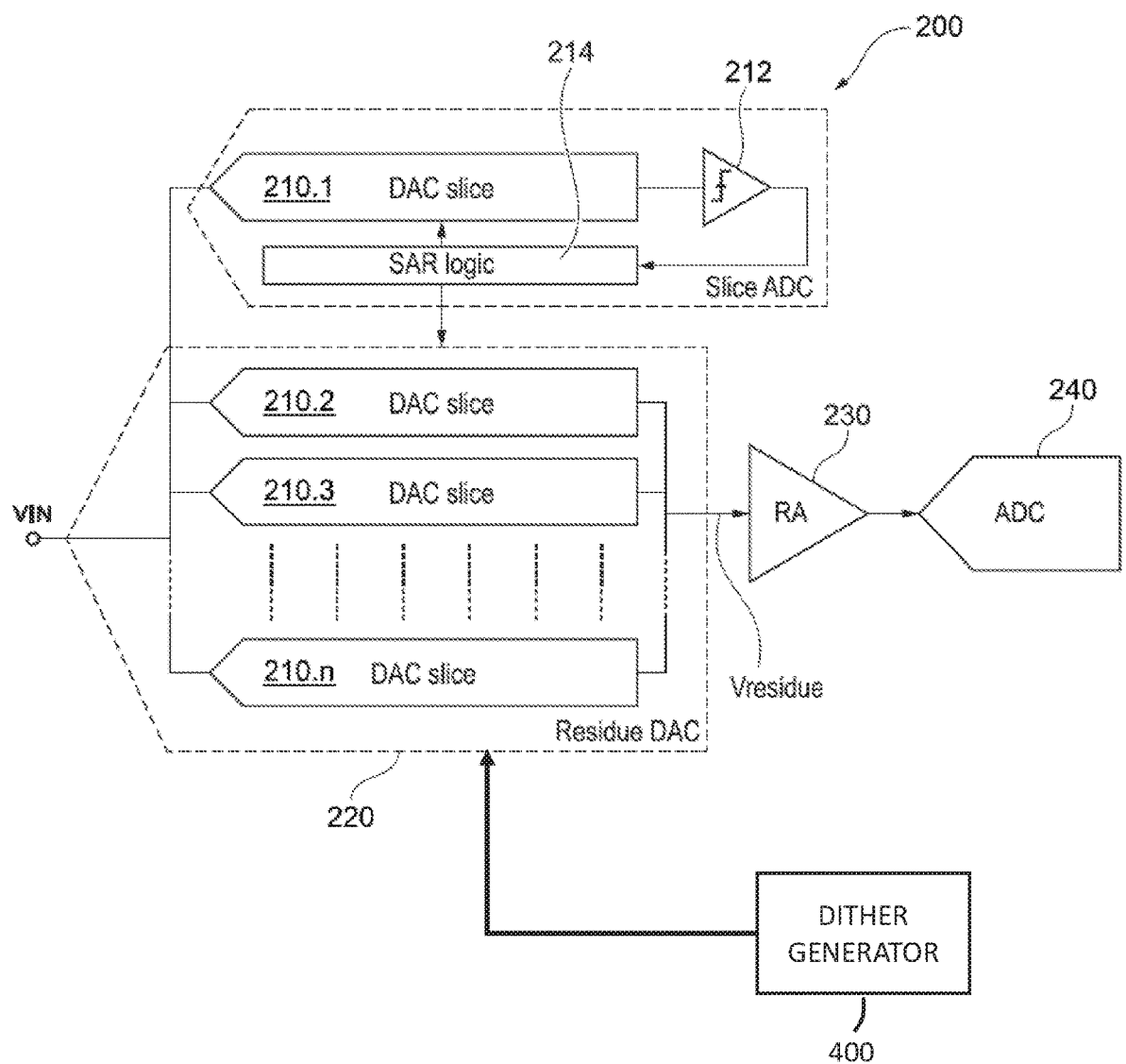
FIG. 7 illustrates an embodiment of the present disclosure using a sliced architecture.

Such an arrangement is shown in FIG. 7. Here the ADC part 200 has been fabricated using a DAC slice 210.1, and the sampling DAC 220 is formed from a plurality of sampling DAC slices 210.2 to 210.n. Advantageously all the slices are the same. This means each has the same sampling response, in terms of input impedance, acquire time or time constant and the same transition time to transition from sample to hold states. This means the signal in the slices 220.2 to 220.n of the residue forming DAC 220 are the same as the signal in the slice 201.1 of the ADC. At first sight this statement might seem so obvious that it seems superfluous, but in fact, it highlights an important and easily overlooked condition that should be observed to achieve good performance from the sliced architecture of FIG. 7. This will be discussed later.

The dither generator 400 generates one or more random digital words at a time which are supplied to one or more of the DAC slices 210.2 to 210.n within the residue DAC 220.

The dither is preferably applied by setting some of least significant capacitors within the sampling DAC slices to provide a dither value before or during the sampling process such that the analog value on the input signal sampled onto the respective sampling DAC arrays within the slices is effectively modified by the value of the respective dither. However the dither could also be applied after sampling and added to the digital word provided to each of the DAC slices when forming the residue where the residue amplifier has sufficient dynamic range to pass the sum of the residue and the dither to a following stage.

It is advantageous to have the residue DAC made from a plurality of identical elements. This is to ensure that the sampling performance and RC (Resistor-Capacitor) time constant of each slice is well matched.

The following table, Table 1, shows the evolution of voltage from 0 to an arbitrary value of '1' expressed as a function of time constants Tc of a first RC combination as exemplified by a first sample and hold circuit and the voltage on a second sample and hold circuit where its time constant Tc' differs from Tc by being 10% larger.

Put another way, when the first sample and hold circuit has been acquiring the input voltage for 10 of its time constants, the second sample and hold has only seen 9 of its own time constants.

TABLE 1

| Tc | deviation from final value | Fractional voltage | Tc' | deviation from final value | Fractional voltage |
|---|---|---|---|---|---|
| 1 | 0.367879441 | 0.632120559 | 0.9 | 0.40656966 | 0.59343034 |
| 2 | 0.135335283 | 0.864664717 | 1.8 | 0.165298888 | 0.834701112 |
| 3 | 0.049787068 | 0.950212932 | 2.7 | 0.067205513 | 0.932794487 |
| 4 | 0.018315639 | 0.981684361 | 3.6 | 0.027323722 | 0.972676278 |
| 5 | 0.006737947 | 0.993262053 | 4.5 | 0.011108997 | 0.988891003 |
| 6 | 0.002478752 | 0.997521248 | 5.4 | 0.004516581 | 0.995483419 |
| 7 | 0.000911882 | 0.999088118 | 6.3 | 0.001836305 | 0.998163695 |
| 8 | 0.000335463 | 0.999664537 | 7.2 | 0.000746586 | 0.999253414 |
| 9 | 0.00012341 | 0.99987659 | 8.1 | 0.000303539 | 0.999696461 |
| 10 | 4.53999E−05 | 0.9999546 | 9 | 0.00012341 | 0.99987659 |
| 11 | 1.67017E−05 | 0.999983298 | 9.9 | 5.01747E−05 | 0.999949825 |
| 12 | 6.14421E−06 | 0.999993856 | 10.8 | 2.03995E−05 | 0.9999796 |
| 13 | 2.26033E−06 | 0.99999774 | 11.7 | 8.29382E−06 | 0.999991706 |
| 14 | 8.31529E−07 | 0.999999168 | 12.6 | 3.37202E−06 | 0.999996628 |
| 15 | 3.05902E−07 | 0.999999694 | 13.5 | 1.37096E−06 | 0.999998629 |
| 16 | 1.12535E−07 | 0.999999887 | 14.4 | 5.5739E−07 | 0.999999443 |
| 17 | 4.13994E−08 | 0.999999959 | 15.3 | 2.26618E−07 | 0.999999773 |
| 18 | 1.523E−08 | 0.999999985 | 16.2 | 9.2136E−08 | 0.999999908 |
| 19 | 5.6028E−09 | 0.999999994 | 17.1 | 3.74597E−08 | 0.999999963 |
| 20 | 2.06115E−09 | 0.999999998 | 18 | 1.523E−08 | 0.999999985 |

After 10 time constants the first RC circuit is only in error by 0.0045% while the second RC circuit is in error by 0.012%. These numbers seem, at first sight, very small. However, these need to be considered in the context of the resolution of modern ADCs.

When resolution is expressed as a percentage of full scale value, it can be seen that:

```
 8 bits = 0.390625%
10 bits = 0.097656%
12 bits = 0.024414%
14 bits = 0.006104%
16 bits = 0.001526%
18 bits = 0.000381%
20 bits = 0.000095%
```

Thus waiting for 10 RC time constants is not sufficient to realize 14 bit resolution, since the sampled voltage would be more that 1 LSB in error.

Typically, for a 16 bit converter the sample circuit samples for at least 12 time constants; for 18 bit conversion the sampling circuit samples for at least 14 time constants, and for 20 bit conversion the sampling circuit samples for 15 time constants.

The performance of the transistor switches in terms of the on state resistance $R_{ON}$ is limited by the fabrication process. It is possible to put transistors in parallel or make a wider transistor to reduce $R_{ON}$, but this comes at a cost of increased charge injection from the gate of the transistor to the sampling capacitor, which can be viewed as a feature of the gate to channel parasitic capacitance of the transistor. Consequently making the transistor switches wider to reduce $R_{ON}$ compared to the value of the capacitor connected to the switch is not an automatic win as the charge injection problem worsens and degrades the accuracy of the analog to digital converter. However, as will be seen later embodiments of this disclosure allow the on resistance to be increased, and deliberately so, while still maintaining good speed and noise performance.

Another way to make the time constant smaller is to make the sampling capacitor smaller. This, however, hits another fundamental problem in the form of thermal (Johnson-Nyquist) noise. It is known that the root mean square thermal noise $N_{RMS}$ on a capacitor can be expressed as:

$$N_{RMS} = \sqrt{K_B \frac{T}{C}} \qquad \text{Equation 1}$$

$K_B$ is the Boltzmann's constant. T is Temperature in Kelvin. C is capacitance in Farads.

This noise is not caused by the capacitor as such, but rather by the thermodynamic fluctuations of the amount of charge on the capacitor due to the switch resistance. Once the capacitor is disconnected from a conducting circuit this random fluctuation is captured by the capacitor.

The root mean square (RMS) thermal noise, $N_{RMS}$, on a capacitor at 300K is set out below for a range of capacitor sizes.

| Capacitance | Noise Voltage |
|---|---|
| 1 nF | 2 µV |
| 100 pF | 6.4 µV |
| 10 pF | 20 µV |
| 1 pF | 64 µV |
| 100 fF | 200 µV |
| 10 fF | 640 µV |
| 1 fF | 2 mV |

The minimum capacitor size that can be tolerated within a sampling circuit can be calculated as a function of input resolution. It is known to the person skilled in the art that for an ADC the signal to noise ratio can be represented as:

$$SNR = 20 \log\left(\frac{\frac{Vinpp}{2\sqrt{2}}}{N_{RMS}}\right) \qquad \text{Equation 2}$$

Vinpp represents the peak-to-peak value of the input signal.

Since the maximum RMS signal value can be equated to Vref. There is also a quantization noise contribution. The uncertainty in an ADC is ±½ LSB. If this is error is assumed to be triangular across the analog input signal then the effective number of bits (ENOB), becomes $$ENOB = \frac{SNR - 1.76}{6.02} \qquad \text{Equation 3}$$

Suppose an ADC is to sample an input with a full scale range of 5V with 18 bit resolution. The LSB value is $5 \div 2^{18} = 19$ µV. However by the time the quantization noise is taken into account the sampling noise needs to be further reduced to around 11 $\mu V_{RMS}$. This indicates an input capacitance of around 40 pF if the thermal sampling noise is to be less than 1 LSB. If the full scale dynamic range is reduced, then the LSB size is correspondingly reduced and the input capacitance has to be increased to obtain the same noise performance expressed in terms of bits.

The speed of the sampling stage is not the only factor that needs to be taken into consideration as the samples cannot be taken back-to-back as the ADC needs some time to make its conversion.

The process of trialing the bits by switching the capacitors between the reference voltages causes charge redistribution inside the DAC, the charge flowing through the transistor switches and hence subject to an RC time constant. Also, the switching of the capacitors to and from the reference voltage causes abrupt charge draws from the reference voltage, which interact with the inductance of the conductors/tracks between the reference voltage and the capacitors, and with the capacitance of the capacitors themselves to introduce ringing.

Both the ringing and the capacitor to capacitor charge redistribution limit the conversion rate. The ringing needs to be given time to subside below an appropriate value, such as 1 LSB (or the amount of error that redundancy within the ADC can reasonably be expected to correct), and the charge redistribution also needs to be asymptote to an appropriate value. Luckily it turns out that it is not required to wait 14 to 16 time constants after setting the bits in a bit trial before strobing the comparator to look at the result of the bit trial. In practice it is reasonable to wait for a much shorter time, say around 4 time constants in a converter having redundancy. It can be seen that this could add a further (18+3) 4=84 time constants to the conversion time for an 18 bit converter having 3 redundant bits. On a simplistic estimate, with an $R_{ON}$ of 10 ohm and a capacitance of 40 pF, and where the sampling capacitor was also involved in the bit trials of a successive approximation converter, and the settling time on average of 14 time constants is allowed for each sampling of the input signal, this would suggest a conversion rate of around $1/(10 \times 40 \times 10^{-12} \times (14+84)) \approx 25$ MHz.

Pipelining allows the bit trials to be split between different stages of an ADC and while the conversion time between taking a sample and outputting a result is not improved by pipelining the throughput or conversion rate is nearly doubled in a two stage pipeline. The other benefit of pipelining is the ability to provide amplification of the signal as it is passes to a subsequent stage of the pipeline, thus the comparators of the subsequent stage can make faster decisions.

There is still a desire to work at even higher sampling rates without incurring noise penalties. The problem is, as noted before, that none of the solutions are easy. Smaller sampling capacitors reduce the RC time constant and hence allow higher throughput, but at the expense of increased thermal noise.

The inventors realized that an architectural change shown in FIG. 7 could be made to partially decouple the problems of noise from speed, as improving noise performance suggests the use of more capacitance whereas improving speed performance suggests the use of smaller capacitance. The slices can be made with relatively small values of capacitance such that slice 210.1 can be used to perform an ADC conversion and arrive at an interim result relatively quickly but with a noise penalty. The interim result can be used by one or more other slices 210.2 to 210.n to form a residue. The one or more other slices may have bigger values of C, or work in parallel to synthesize a bigger value of C such that the residue has an improved thermal noise figure.

Operating a plurality of sampling stages in parallel is not as simple as merely connecting a load of stages together. That, as with many things in high speed analog to digital converters overlooks some of the fundamental physics that makes this task so challenging.

The stages should be "matched" to set their RC time constant to within an acceptable value. The limit of what constitutes "acceptable" depends on a time budget for sampling the input signal and also for allowing charge redistribution and ringing to settle to around 1 LSB of the channel or slice. Previously, the discussion examined the problem of RC time constant mismatch in the context of a DC (Direct Current) signal. That was a useful introduction to the following passages of this disclosure where RC time constant mismatch with AC (Alternating Current) signals is considered.

Looking more specifically at the sampling problem, this is once again a function of the dynamic range of the converter and its maximum bandwidth.

Suppose the ADC is to sample a sinusoid, Vinput, having a dynamic range of 5V at 10 MHz. This has an amplitude of 2.5 V and an angular frequency of $2\pi \times 10 \times 10^6$ radians per second.

$$V\text{input} = 2.5 \sin(2\pi \times 10 \times 10^6) \qquad \text{Equation 4}$$

The maximum rate of change of voltage occurs around the zero crossing point and is $2.5 \times 2 \times \pi \times 10 \times 10^6 = 157 \times 10^6$ volts per second.

So, 1 picosecond of sampling skew (a timing error) would equate to 157 µV of error. It was noted previously that for a dynamic range of 5V and 18 bit resolution then the LSB size was 19 µV. Therefore, this small timing skew of 1 ps introduces an error of 8.3 LSB. This timing skew interacts with any variations in RC time constant between stages or slices to increase mismatch errors in the voltage sampled onto each slice.

To address this the inventors have chosen an architecture where for each slice integrated circuit lithographic precision is used to ensure that the capacitors and transistors in each sampling arrangement scale together to maintain a matched RC sampling time constant, and the sampling switches are substantially co-located to minimize timing skew.

In an embodiment where the slices are formed from switched capacitor arrays, each slice includes a sampling DAC, and the sampling stages are matched so as to have capacitors and transistors at a given electrical position in one slice being substantially the same as the equivalent capacitors and transistors in others of the slices.

In an embodiment of this disclosure, a unit cell comprising a unit size capacitor C in association with unit sized transistors for connecting one of the plates of the capacitor to VIN, VREF1 and VREF2 respectively is used repeatedly to form the slices. Each unit cell is nominally identical to each other unit cell in its electrical performance. The cells can be grouped together, either permanently on or as part of a dynamic allocation of cells to groups. Two cells can be grouped together to form a capacitance of 2C, four cells can be grouped together to form a capacitance of 4C and so on. If desired, cells do not need to be grouped together to from groups in a binary sequence of weights. Cells could be grouped to form capacitors to provide redundancy. Cells can also be connected in series to form effective capacitances of C/2, C/3, C/4 and so on. It can be convenient to work predominantly with cells of 2C as a way of reducing the switch control and driver requirements, and only to have one or a few cells of 1C being individually controllable.

Returning to the issue of matching the RC time constants, these have an effect on sampling AC signals. It was shown in Table 1 that changes in the time constant can give rise to significant errors in the sampled value of a DC signal. However, often the ADC is to sample varying (AC) signals.

It is desirable for the slices to sample the same value, to within acceptable limits, but this raises the question of how important is the matching when looking at AC signals. The inventors appreciated that the issue of matching has been overlooked in the past. In one example, a first stage of a pipeline converter resolves the 6 MSB of the signal to be digitized. The input signal VIN is sampled onto two sampling DACs. One sampling DAC, called "Big DAC" has three times the capacitance of the other sampling DAC, called "Small DAC". The small DAC is used to perform the SAR trials, so as to save power, but once it has finished then both DACs are connected to a common node such that their residues are merged together in order to meet the 13 bit noise requirement. However, the example does not consider or have any teaching of scaling the transistor switches to match the sampling time constants of the DACs or of co-locating the sampling switches to minimize timing skews.

The effect of the change in the RC time constant is most easily understood if treated as being a phase shift.

The phase shift can be modelled as that of an RC low pass filter, where the phase shift φ is given by:

$$\phi = -\arctan(2 1\pi f R C) \quad \text{Equation 5}$$

Suppose a RC sampling circuit is designed to have a −3 dB bandwidth of 10 MHz. Suppose also that C is chosen to be 40 pF in order to meet the noise performance figure required to achieve 18 bits of resolution. Using the following relationship:

$$f = \frac{1}{2\pi RC} \quad \text{Equation 6}$$

Plugging in f is 10 MHz, and C is 40 pF, the value of R can be calculated. In this example, R is 40Ω. Evaluating Equation 5:

$$\phi = -\arctan(2\cdot\pi\cdot 10\times 10^6 \times 40 \times 40\times 10^{-12})$$

$$\phi = -0.10019 \text{rad}$$

At first sight, this phase shift looks negligible. However, if RC changes by +10% then φ=−0.11013rad. This is a difference of 0.001rad, which equates to a time difference of:

$$\frac{0.001}{2\cdot \pi \cdot} \times \frac{1}{10\times 10^6} = 1.59\times 10^{-11} \text{ seconds}$$

Thus, in this example a change of 10% in the RC time constant yields a minute phase change at 10 MHz of $1\times 10^3$ radians, but this phase change turns out to be equivalent to 16 picoseconds timing error which equates to a mismatch between the slices of 133 LSB for a 5 V peak-to-peak input signal at 10 MHz.

The above calculation shows that mismatches in component values manifest themselves as large sampling time errors as the frequency increases. However, this problem seems to have been overlooked in the past.

Having noted that variations in the RC value of a sampling stage can introduce phase small phase shifts which can manifest themselves as many LSB of error, the inventors have, in some embodiments of this disclosure, taken the step of adding a series resistor into the RC sampling circuit. This is counter intuitive since adding a resistor clearly lowers the bandwidth of the circuit and hence increases the sampling time for an input signal. Such as approach is diametrically opposing the steps that would be taken to build a fast ADC. However, the effective "on" impedance of the transistor switches may change with temperature and input voltage by a few percent and although careful layout and bootstrapping can go a long way to reducing variation, adding a series resistor (whose thermal performance is more stable than a transistor) can improve the matching between slices. The resistors may have values between ohms and several hundred ohms. In an embodiment resistors of around 160Ω were used. The transistors may have on resistances of only a few ohm, and transistor to transistor on resistance variation may only be fractions of an Ohm. This approach significantly improves matching between the sampling DAC slices.

As a result, it is preferable to make the sampling section of each slice nominally identical to the sampling sections of each of the other slices.

Returning to FIG. 7, some or all of the remaining DAC slices 210.2 to 210.n are configured to sample the input VIN simultaneously with slice 210.1 and to act together to form a residue DAC 220 to form an analog output voltage Vresidue representing the difference between VIN and Vdac, where Vdac is the voltage produced by the residue DAC 220 when driven with the "result" of the analog to digital conversion formed by the first DAC slice 210.1 when driven by the SAR logic 214 to arrive at a P bit conversion, where P is the effective resolution in bits of the slice 210.1.

The first DAC slice 210.1 may be formed from a non-subdivided switched capacitor array, a segmented or subdivided switched capacitor array or a sampling capacitor and associated DAC.

In use, each of the slices 210.1 to 210.n is coupled to VIN and used to sample VIN. The sampling switches 350 (see FIG. 6A) of the slices are co-located to ensure that they receive their "hold" instruction at the same time and also to ensure that each switch 350 suffers the same process, voltage, and temperature (PVT) variation as each other switch. This helps ensure that each sampling DAC circuit has the same electrical performance as each other sampling DAC, for example matched RC time constants, and the switches 350 transition between conducting and non-conducting at the same slew rate and at the same time, thereby avoiding phase shifts between the DAC slices 210.1 to 210.n when operating concurrently to acquire (for example sample and hold) a shared input signal.

After the input signal has been acquired, the first DAC slice 210.1 can be used to form a SAR conversion of the sampled signal. Such a conversion may include use of a further sub-ADC, for example in the form of a Flash ADC to provide a near instantaneous conversion of the first two or three bits of the P bit conversion performed by the DAC slice 210.1. Such SAR conversions can also include the inclusion of additional bits to provide redundancy in the result and that the conversion can also be performed with radix <2 technology and that multiple bits can be determined in a single bit trail period, for example by using a three level quantizer in place of the comparator. As the bit trial progresses, the status of the most significant bits of the P bit output word become known before the status of the least significant bits of the P bit output word. This allows the output from the SAR logic 214 to be provided to the slices 210.2 to 210.*n* in the residue DAC 220 in order to set the bits in those DAC slices on a bit by bit basis thereby allowing the voltage transitions caused by switching the capacitors in each slice into an appropriate configuration, and the ringing that this may introduce, has time to die away before the output from the residue DAC 220 is gained up by the residue amplifier 230.

In order to reduce the magnitude of voltage transitions, the setting of the bits in the slices 210.2 to 210.*n* within the residue DAC 220 can be staggered in time such that the transitions do not happen in unison. Furthermore, the magnitude of the initial transitions, for example relating to the most significant bit and the next most significant bit can be reduced by initially setting half of the slices 210.2 to 210.*n* with their most significant bits set and the other half of the slices with their most significant bit unset. Consequently, as a result of the first bit trial statistically only half of the DAC slices are likely to have to be transitioned. The same technique can be used with the next most significant bit and so on. An alternative approach may be based on the fact that, in use, the input signal may be oversampled compared to its Nyquist frequency limit and hence statistically the first few bits of the input word are unlikely to have changed between one sample and an immediately following one.

It is also possible to allow one or more DACs within the residue DAC to participate within several of the bit trials. Put another way, if only DAC slice 210.1 is being used to perform analog to digital conversions then that single DAC slice can only perform one bit trial at a time. However if three of the DAC slices, for example 210.2, 210.3 and 210.4 of the residue DAC 220 are temporarily enabled to work with respective comparators (not shown) coupled to the SAR logic 214 then the arrangement shown in FIG. 7 can perform two bit trials simultaneously, thereby reducing the time required for the ADC part 200 to convert P bits.

The use of the slice arrangement allows each DAC slice 210.1 to 210.*n* to have a smaller capacitance therein, which reduces the RC time constant of each DAC slice, and consequently a conversion could be performed more quickly. Earlier on in this description, the thermal noise associated with a capacitor at 300 K was tabulated. This was used to show that, in a worked example where a dynamic range of 5 V was to be converted with 18 bit resolution, then the minimum capacitance of the DAC needed to be at least ~40 pF. However, if all of the DAC slices where formed such that they each had an effective capacitance of 4 pF then connecting the DAC slices 210.2 to 210.*n* to form a residue DAC places their capacitances in parallel. Thus, if 10 DAC slices 210.2 to 210.11 were provided in the residue DAC 220, then connecting them in parallel would create an effective capacitance of 40 pF even though each residue DAC had the superior sampling time and settling speed associated with being a 4 pF DAC slice. It should further be noted that the residue at the output of the first DAC slice 210.1 can also be connected to the output of the residue DAC 220 such that it also contributes to the reduction of thermal noise of the bank of capacitors.

Figure 8:
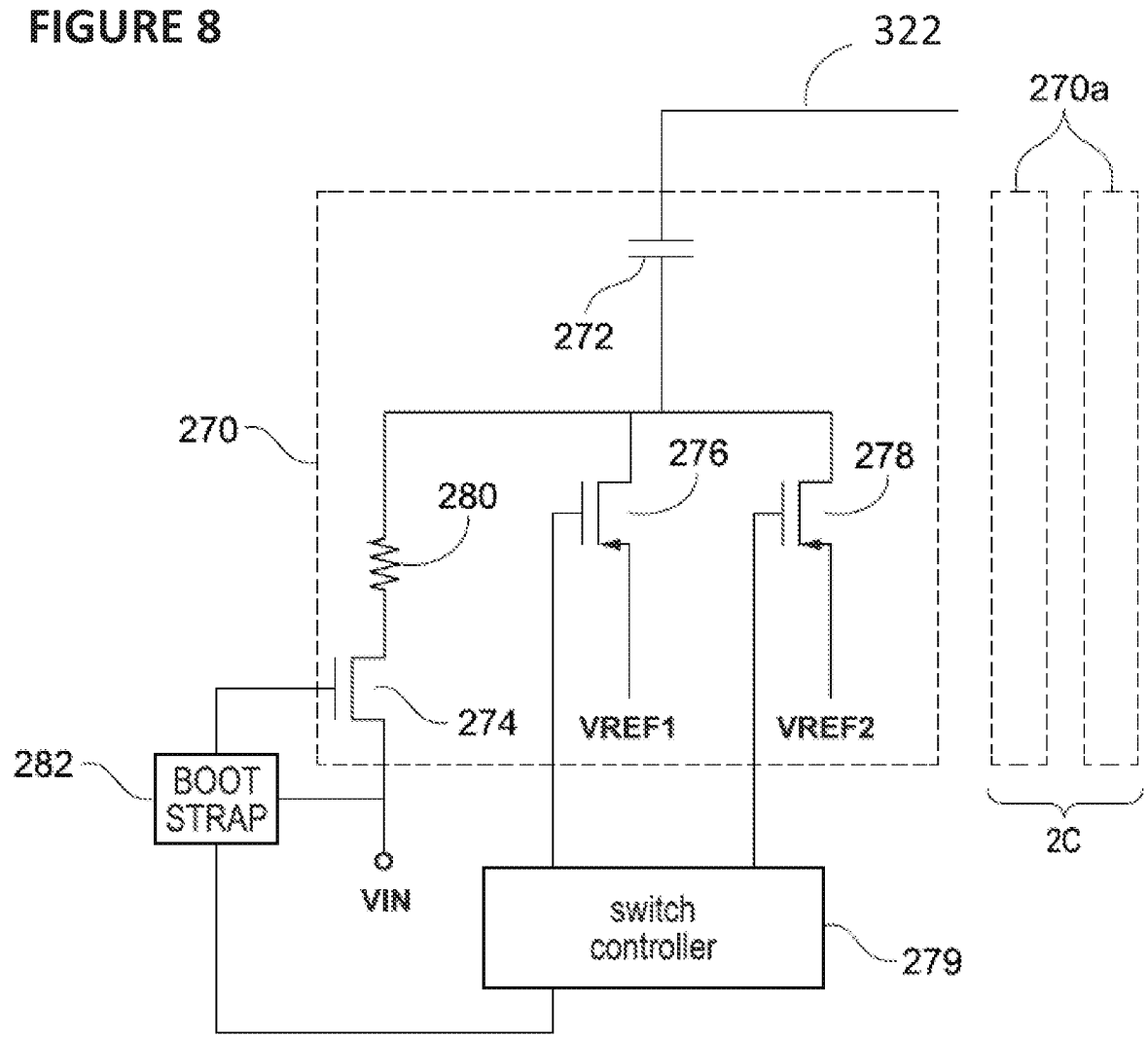
FIG. 8 is a representation of a unit cell that is used to form sliced DACs.

As noted earlier, the sampling DACs can be formed from repeated unit cells. One such unit cell 270 having a value 1C is shown in FIG. 8. The unit cell comprises a capacitor 272 having a value of 1C. One of its plates, the uppermost plate in FIG. 8, is connected to the shared conductor 322 (FIG. 6A). The bottom plate of the capacitor is connected by a three-way switch formed of transistors 274, 276 and 278 to allow the bottom plate to be isolated, connected to VIN, VREF1 (typically from a precision voltage reference) or VREF2 (typically 0V). Each of the transistors is controlled by a switch controller 279, such as SAR logic 214 from FIG. 7. The transistor 274 connecting the capacitor to the input node VIN may be in series with a resistor 280 so as to more accurately define the "on" resistance presented by the unit cell when it is sampling the input signal at VIN. The transistor 274 may (or may not) have its gate control signal modified by a bootstrap circuit 282 so as to hold a gate to source voltage Vgs of the transistor 274 constant with respect to VIN. The unit cell 270 may be placed in parallel with other unit cells to form properly scaled combinations of switch and capacitor, as represented by unit cells 270*a* and 270*b* being placed in parallel to form a 2C weight, and so on.

If, for example, only 5 binary weighted sampling capacitors are required in the sampling part 73 of the sub-divided switched capacitor DAC then it follows that $2^5-1=31$ unit cells 270 are required. The unit cells can be very well matched within an integrated circuit. This means that the unit cells may be permanently assigned to groups of 1, 2, 4, 8, and 16 if desired, or alternatively the groupings may be dynamically formed on the fly by the switch controller at each sampling event to randomize any mismatch errors. The cells may be operated in a unary encoding style and the cells participating in such an encoding scheme of the output may be selected dynamically (on the fly).

Figure 9:
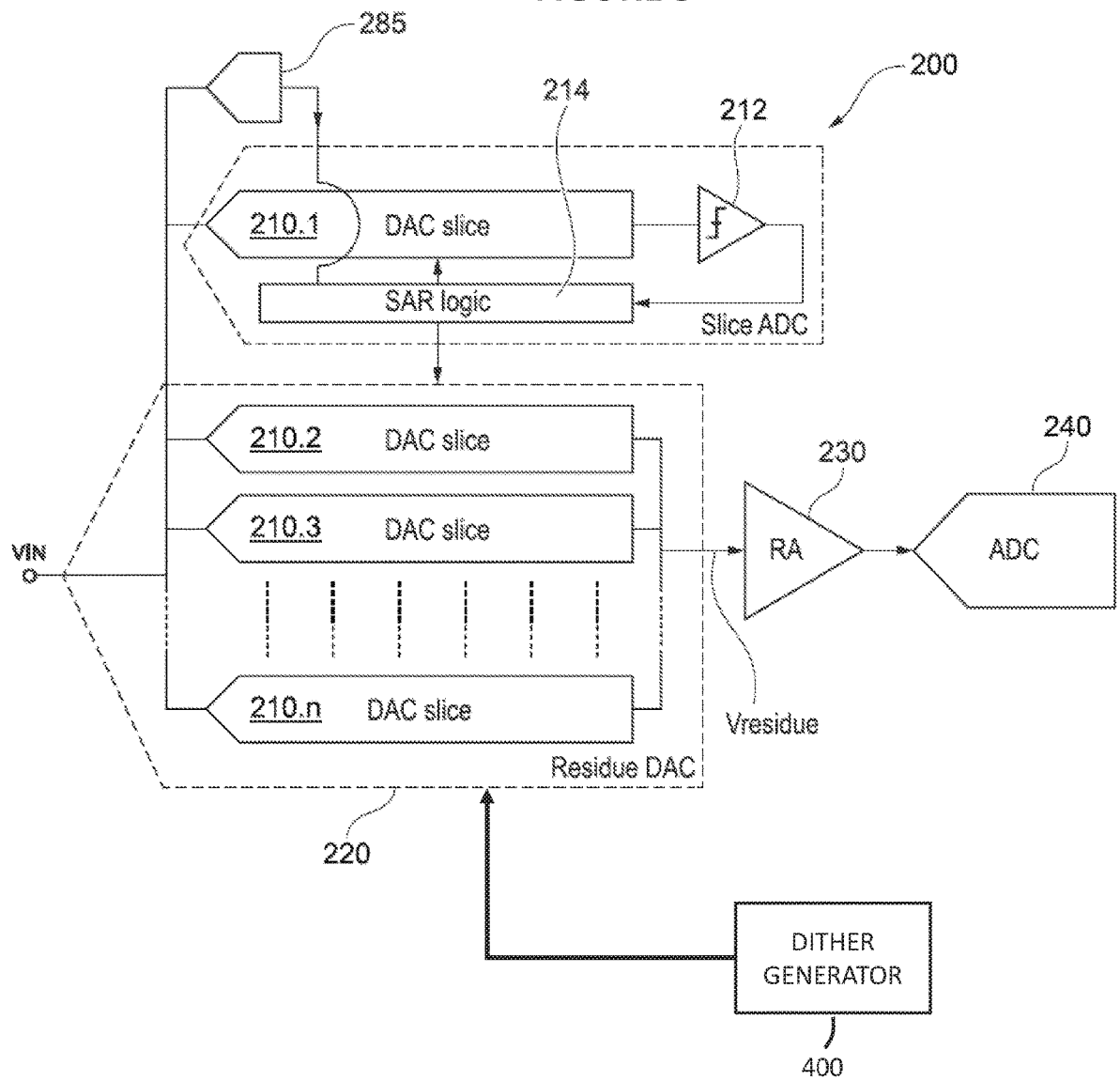
FIG. 9 is a schematic diagram of a further embodiment of the disclosure.

FIG. 9 shows a variation of FIG. 7 where a sub-DAC 285, such as a 3 bit Flash converter, is used to set the three most significant bits of the SAR converter more quickly. Less than or more than 3 bits may be converted by the sub-DAC 285.

Figure 10:
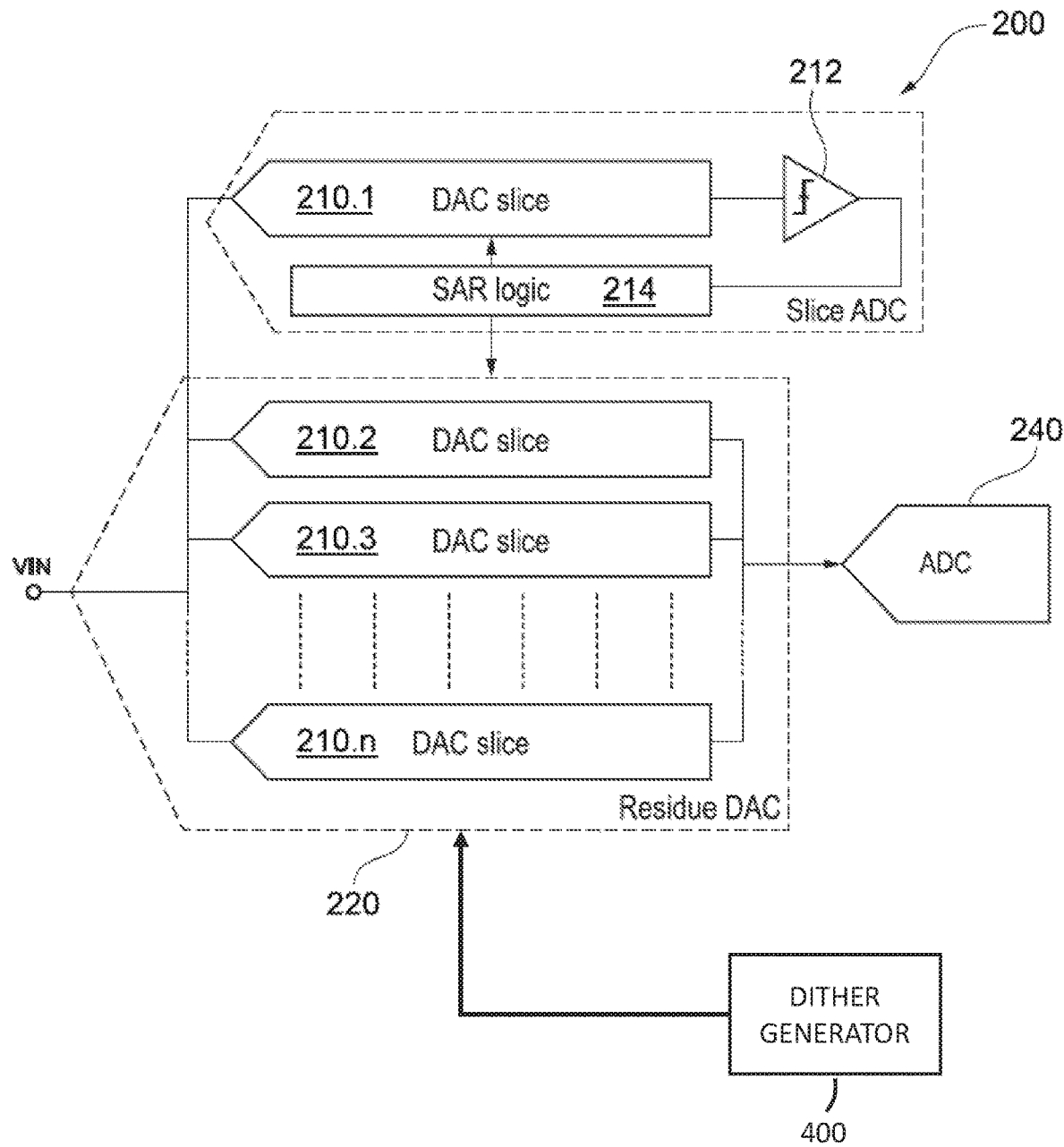
FIG. 10 is a schematic diagram of a further embodiment of this disclosure.

The voltage residue formed by the sampling DAC 220 may then be gained up by a residue amplifier 230 before being provided to a further analog to digital converter 240. It should also be noted, as shown in FIG. 10, that the residue amplifier 230 need not necessarily be provided.

Figure 11:
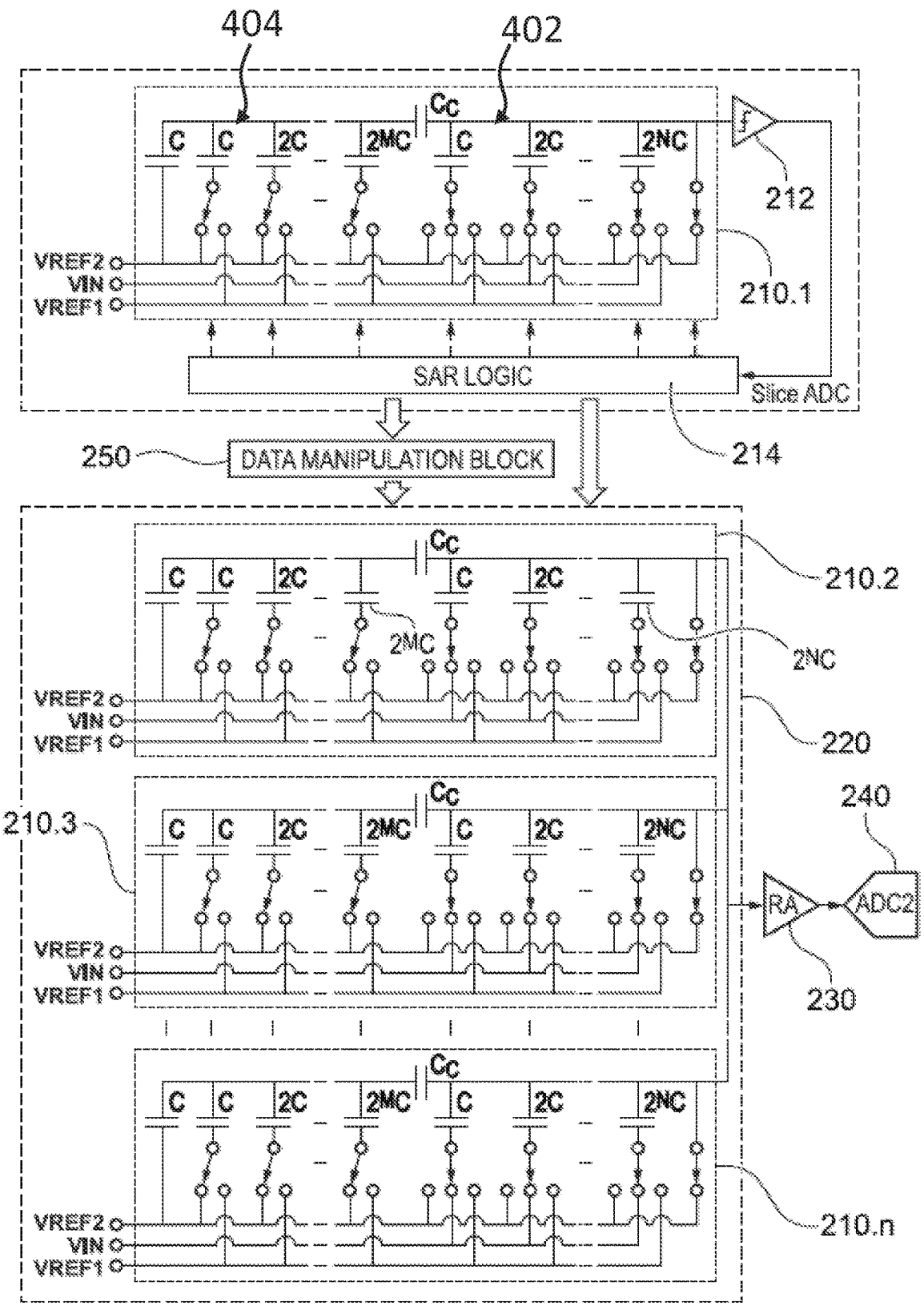
FIG. 11 is a circuit diagram showing details of an embodiment of the stage shown in FIG. 7 in greater detail.

FIG. 11 schematically shows the circuit arrangement of FIG. 7 in greater detail. In this example each of the slices 210.1 to 210.*n* are identical, and each comprise a segmented capacitor array forming a sampling DAC 402 together with a sub-DAC 404. The sampling DACs are identical. Furthermore, in this configuration shown in FIG. 11 the sub-DACs are also identical. However this need not be the case. The sub-DACs could be formed with lower resolution if desired. Suppose, for example, that the DAC slice 210.1 was an 8 bit slice, comprising 5 bits (N=5) in its main DAC and 3 bits (M=3) in its sub-DAC if eight DAC slices 210.2 to 210.9 are provided in the residue DAC 220, each having a resolution of 5 bits, then these eight residue DACs effectively could be driven with different control words to provide a further 3 bits of resolution, within the sub or main DAC the bring the residue DAC back up to an 8 bit device. Thus the sub-DACs of the slices 210.2 to 210.*n* can be shortened or omitted if desired. Alternatively, if the slices are all the same as shown in FIG. 11, then the residue DAC can be driven to apply sub-LSB dither to its output signal for supply to the next stage in the pipelined analog to digital converter. These approaches can be adopted together.

In the arrangement shown in FIG. 11, a data manipulation block 250 is provided between the SAR logic 214 and each of the slices 210.2 to 210.n in the residue DAC 220. The data manipulation block allows the digital word to each of the DAC slices 210.2 to 210.n to be individually set. Thus deliberately selecting different words provides for enhanced resolution or the incorporation of dither.

Figure 12:
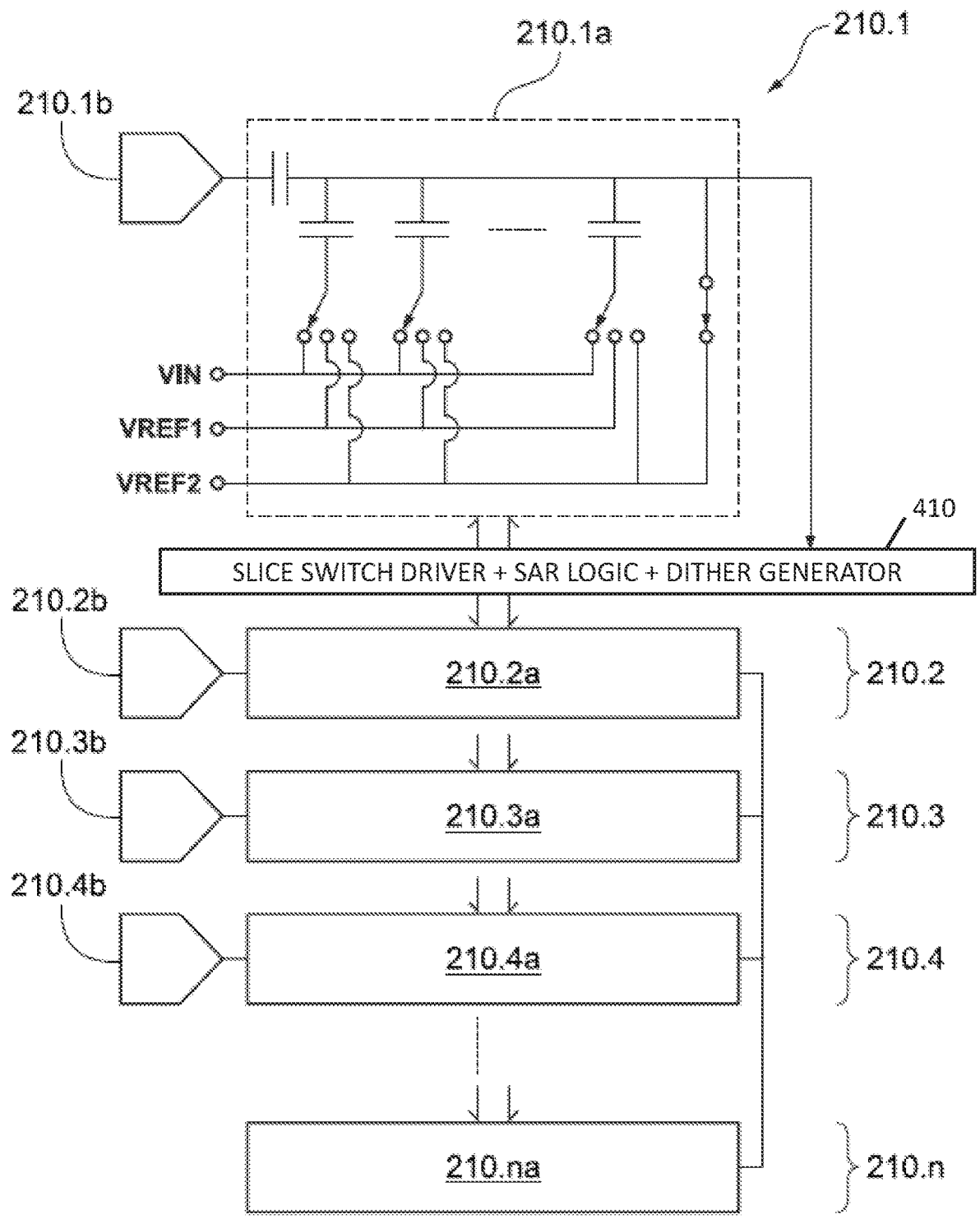
FIG. 12 is a circuit diagram of a variation of the circuit shown in FIG. 11.

FIG. 12 is a generic representation of FIG. 11 where each slice 210.1 to 210.n is divided into a sampling DAC portion 210.1a, 210.2a and so on up to 210.na and a sub-DAC 210.1b, 210.2b, 210.3b and so on. The sampling DACs 210.2a to 210.na are identical to each other. The sampling DAC 210.1a may or may not be the same as the sampling DACs 210.2a to 210.na, but advantageously has very similar electrical properties, and this is best achieved by forming it of the same unit cell construction as the other slices. The sub-DACs need not be the same. The sub-DAC 210.1b may be formed, for example, with more bits than the other sub-DACs. Indeed not all of the slices need be provided with a sub-DAC. Here the sub-DAC associated with sampling DAC210.na has been omitted. The switch slice driver, the SAR logic controller and the dither generator can be provided in a single logic block 410.

The current flow between the capacitors along the bond wires can perturb the voltage reference. The arrangement described herein has the advantage of reducing the perturbation of the voltage reference during the bit trial sequence and also gives the potential for the DAC slices 210.2 to 210.n in the residue DAC to be provided with a buffered version of the reference voltages which may be provided by way of a further buffer such that the reference voltage provided to the first slice 210.1 does not suffer perturbation due to switching of the capacitors in the slices 210.2 to 210.n to set up the residue DAC. It can be seen that if the capacitance of the capacitor array is effectively reduced from 40 pF to 4 pF then the current drawn from the reference is correspondingly reduced. Thus the energy required for conversion is reduced.

If, for example, the sampling DACs 210.1 to 210.n were all built the same, and the residue DAC has 8 slices summing to 40 pF (for noise purposes) then each slice would have a capacitance of 5 pF. This 5 pF is split up between, say, 31 unit cells in a 5 bit example or 63 unit cells in a 6 bit example of a sampling DAC array. This gives a unit capacitor size of 161 fF in the 5 bit case or 79 fF in the 6 bit case. It can be seen that this approach allows the sliced ADC to achieve a high bandwidth as the RC value of each unit cell is very small even with a modest series resistance to swamp any transistor to transistor variation. Also as only one of the slices performs the bit trials the currents drawn from the current source are much reduced. This reduction of charge required to perform the bit trials also means that some resistance can be deliberately introduced into the charge path to reduce ringing within the supply voltage to the capacitors of the DAC.

Figure 13:
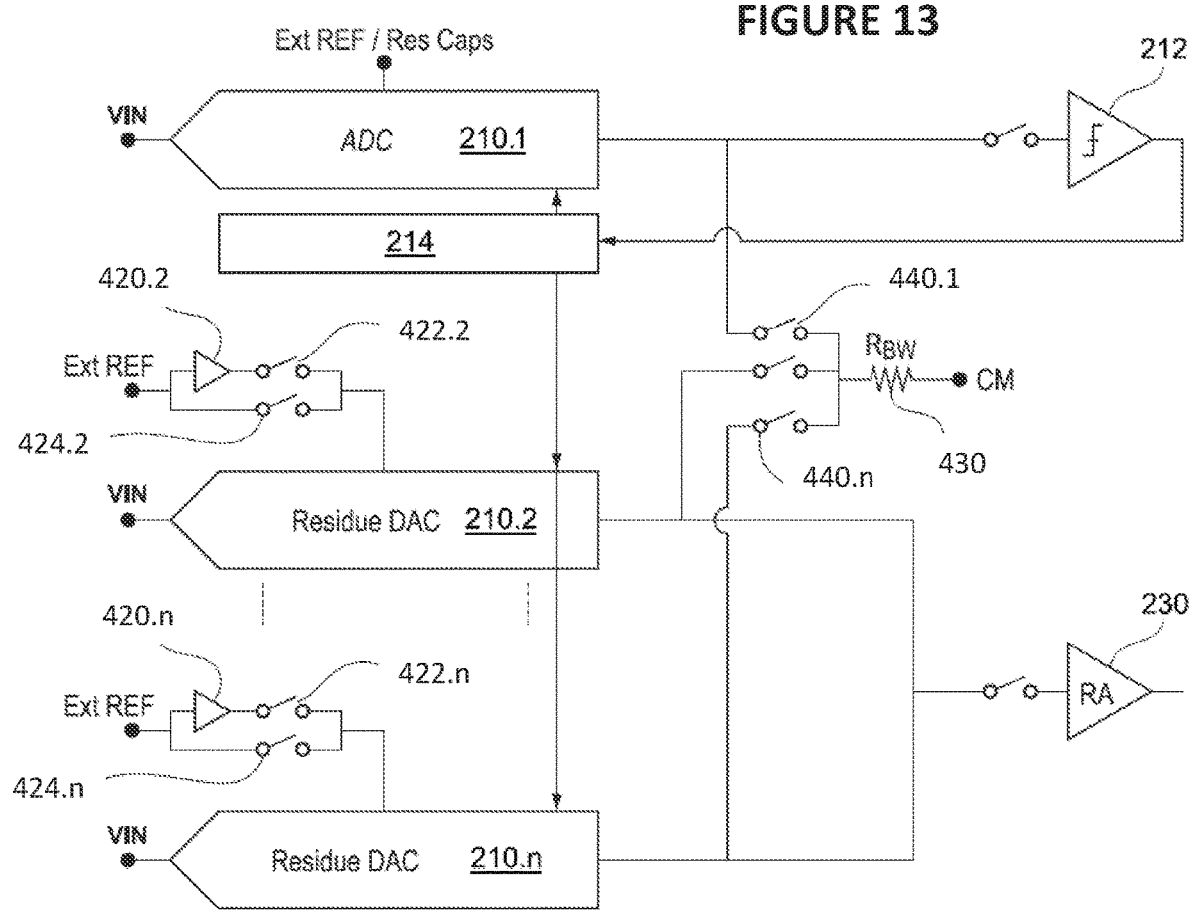
FIG. 13 is a circuit diagram of a further embodiment of the present disclosure showing the use of respective buffer amplifiers and a shared bandwidth limiting resistor.

FIG. 13 shows an arrangement where at least some, and preferably each, of the slices 210.2 to 210.n of the residue DAC is connected to the external reference by way of a respective buffer 420.2 to 420.n which is selectively disconnectable from the slice 210.2 to 210.n by a series switch 422.2 to 422.n and where the slice 201.2 to 210.n can also be directly connected to the external reference by way of a further switch 424.2 to 424.n. Consequently, the residue DAC slices 210.2 to 210.n can each be charged by way of the buffer for the majority of the set up time thereby reducing the current drawn from the external reference, and be connected to the external reference towards the end of the settling time such that they settle towards a correct voltage unaffected by offsets within their respective buffers. Furthermore each of the switched capacitor arrays can have their bandwidths limited by selected connection to a bandwidth limiting resistor 430 by way of respective switches 440.1 to 440.n.

Figure 14:
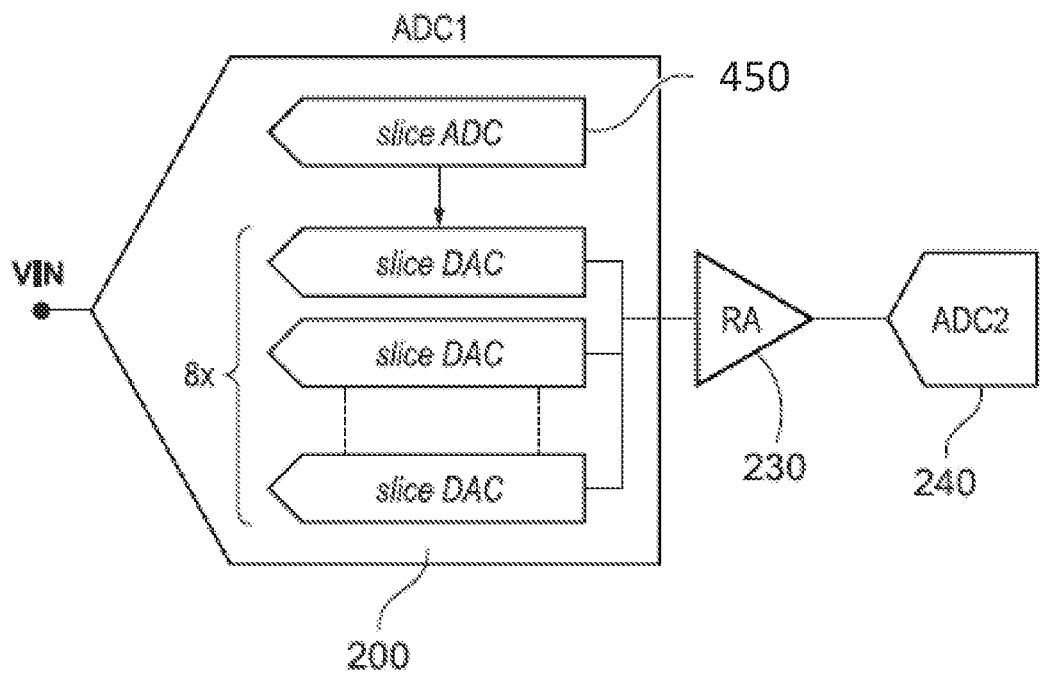
FIG. 14 is a schematic diagram of a two stage pipelined ADC in accordance with the teachings of this disclosure.

For completeness, FIG. 14 schematically illustrates one embodiment of the present disclosure where a mini ADC 450, formed from one of the slices, works in association with eight other slices which form the residue DAC to drive the residue amplifier 230. In this embodiment the residue amplifier is connected to a further ADC 240. The first ADC, in this example, provides 6 or more bits of resolution while the second ADC 152 provides the remaining number of bits, for example 8 or more 9 bits of resolution to reach the desired overall resolution of the ADC.

In other examples, each slice may present a capacitance of 3.2 pF, but the total digital to analog converter presented for the purposes of thermal noise amounts to 25.6 pF with the DACs operating in parallel.

It can be seen that the time to complete an SAR conversion can be expected to be longer than the time required to set up the individual DAC slices within the residue DAC. Furthermore, the output from the residue DAC is only really required after the SAR conversion from the first ADC is completed. This allows for the possibility of sharing a residue DAC between two or possibly more SAR slices. The SAR slices can be operated in a ping-pong manner such that one of them is about half way through its conversion when the other is sampling. Under such an arrangement the residue DAC has to sample at the same time as each of the SAR slices but immediately after it has finished sampling it can already be preset with at least half of the output word. The use of this approach is further enhanced by the use of a sub-ADC, such as a Flash ADC in order to get the first few bits of the bit trial performed rapidly or to reduce the signal swing during trials.

Figure 15:
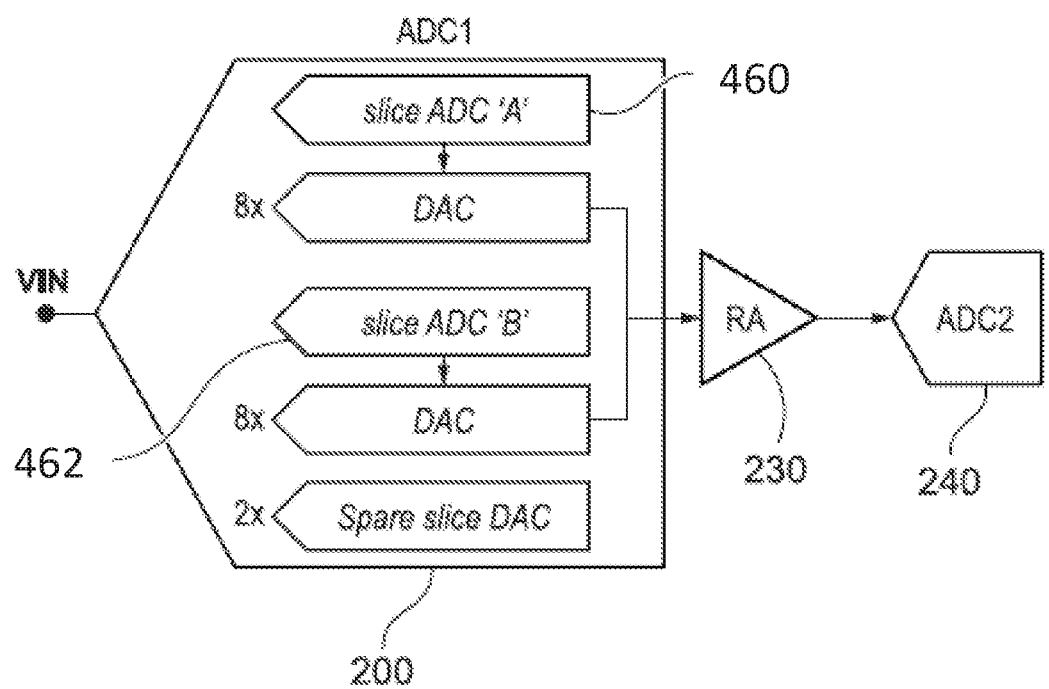
FIG. 15 is a schematic diagram of a two stage pipelined time interleaved ADC in accordance with the teachings of this disclosure.

FIG. 15 schematically illustrates an alternative embodiment of a pipelined architecture where two fast ADCs 460 and 462 are provided within ADC1 200, and each of the fast ADCs is associated with eight DAC slices. The first ADC 200 is operated in a time interleaved manner and hence exceptionally minor mismatches might still result in the generation of additional sampling tones. In order to mitigate this one or more slices can be shuffled amongst the slices of each one of the residue DACs in order to reduce the risk of tones.

Figure 16:
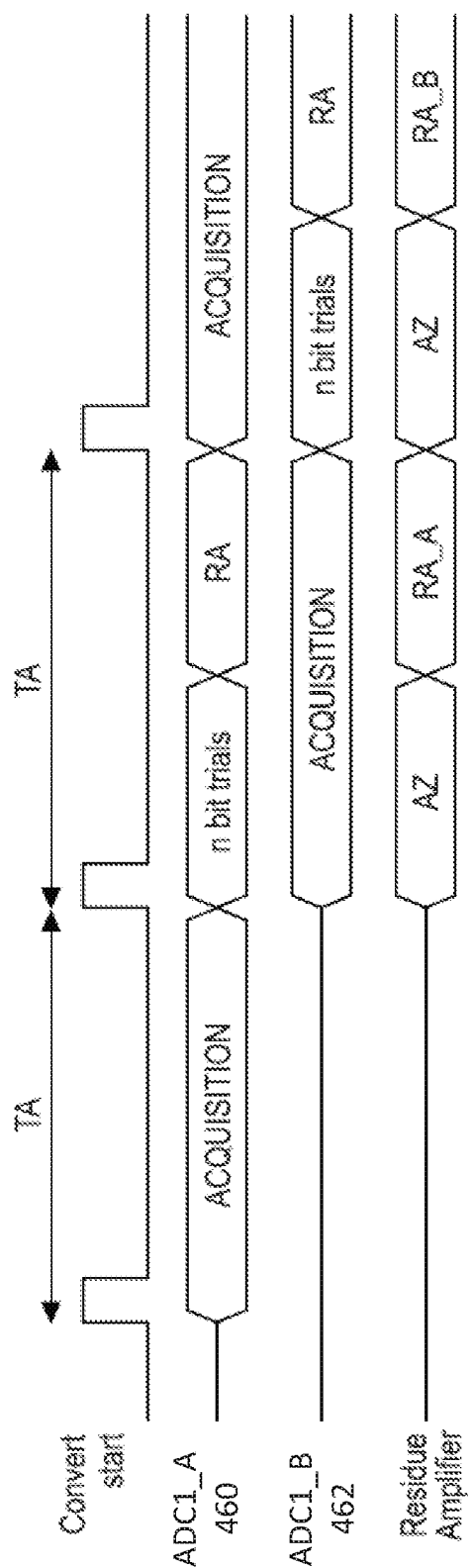
FIG. 16 is a timing diagram for the time interleaved ADC shown in FIG. 15.

FIG. 16 schematically shows a timing diagram for the arrangement in FIG. 15. As it can be seen each of the first ADCs designated "A" and "B" in FIGS. 15 and 16 operates out of phase with the other such that when ADC "A" 460 is performing its acquisition in a time period $T_A$ between successive "convert start" signals, the ADC "B" 462 undertakes its bit trials and then passes its result to the residue amplifier. In each period $T_A$ the residue amplifier extends approximately half of its time (denoted RA_A or RA_B) amplifying the residue from one of the residue DACs associated with the respective slice ADCs "A" and "B", and the other half of its time undergoing auto-zeroing, AZ, in order to remove offset errors therefrom. The techniques and approaches use in auto-zeroing are well known to the person skilled in the art and need not be described here.

Although the description has focused on the DAC slices being in the form of switched capacitor arrays which can act as host to the sampling capacitor and the digital to analog converter concurrently, the teachings of the present invention can also be applied to circuit arrangements where the sampling arrangement and the DAC are separated The number of stages in the pipeline can vary between two and the resolution of the converter. Put another way, each stage in the pipeline could be arranged to convert only one bit. The teachings of this disclosure would still be applicable to such a deeply pipelined arrangement as the time constant of each stage would be reduced by the multiple slices of a given stage which will act in parallel to provide the required noise performance. Thus the present disclosure is highly flexible and can be used in a vast number of configurations where DACs are required to interact with capacitor based sampling circuits.

The interleaving ratio can be 2× or more.

Figure 17:
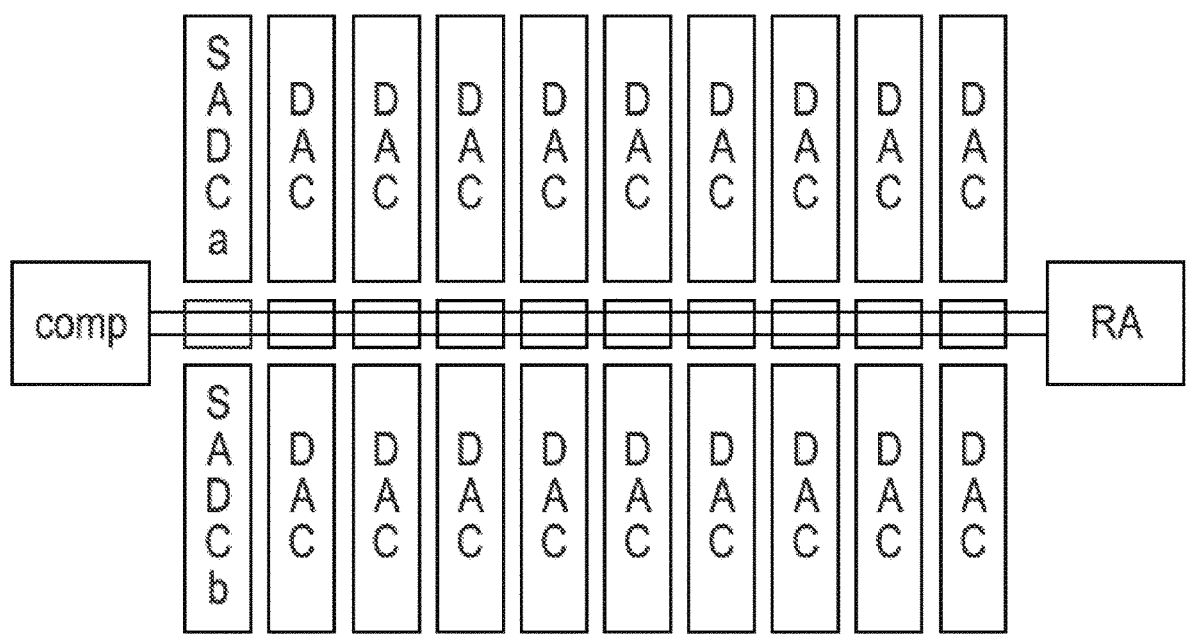
FIG. 17 is a plan view of a DAC layout floorplan on a semiconductor die.

FIG. 17 schematically illustrates an embodiment of a layout floorplan of the circuit shown in FIG. 15. The DAC slices are arranged in parallel between the comparator, "comp", associated with the slice ADC (sADCa and sADCb), and the residue amplifier (RA), associated with this stage. One of the slices within each bank of switched capacitor DACs has, in this example, been allocated the role of being the slice ADC (sADC).

Figure 18:
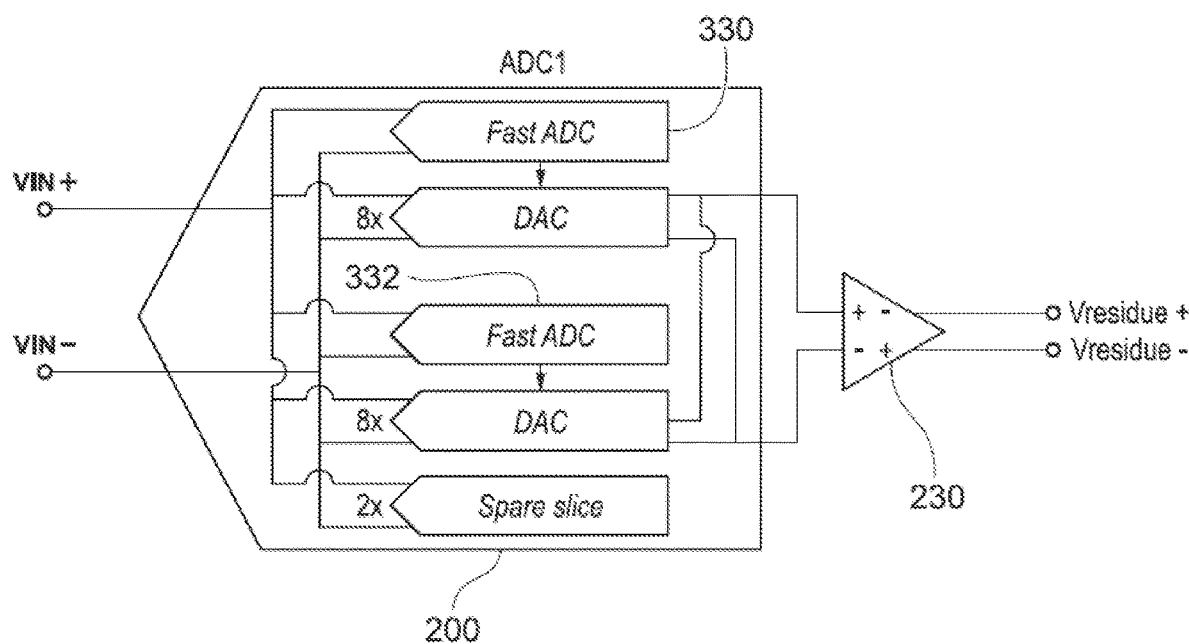
FIG. 18 is a schematic diagram of a dual ended (differential) ADC in accordance with the teachings of the present disclosure.

All of these circuits can be implemented within a differential ADC arrangement 200 as shown in FIG. 18. Here capacitor arrays associated with the positive and negative inputs have each provide a residue signal to a differential RA 230.

Figure 19:
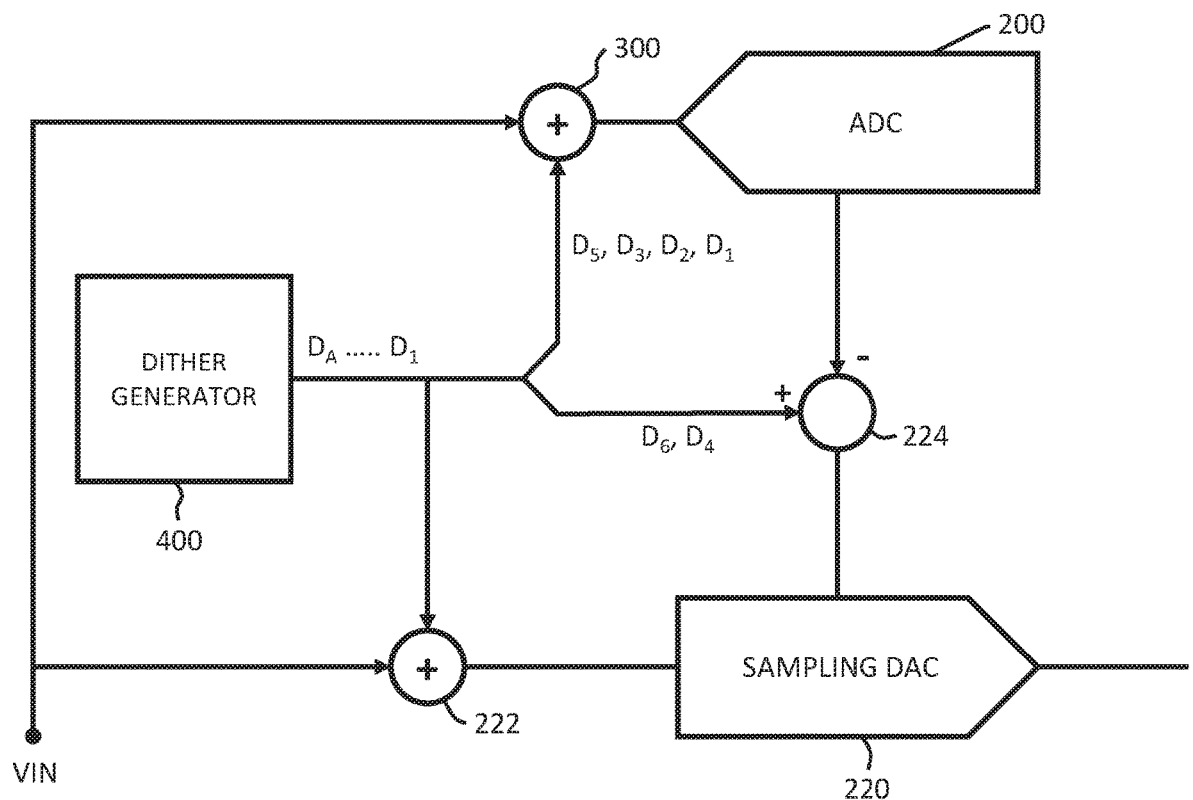
FIG. 19 is a schematic diagram of an ADC stage constituting an embodiment of the present disclosure illustrating a relationship between dither words.

FIG. 19 builds on the teachings of FIG. 5, and the same reference numbers are used for like parts. Here the dither generator 400 generates a first dither value, which is represented as bits $D_A$ to $D_1$, where A represents an arbitrary number. The dither can represent an integer part and a fractional part (referred to the LSB of the stage).

For ease of discussion (but without limiting to the specific example given here) suppose that A=6, such that the first dither word comprises bits $D_6$, $D_5$, $D_4$, $D_3$, $D_2$, and $D_1$. Also suppose that $D_6$, $D_5$, and $D_4$ represent an integer part and $D_3$, $D_2$, and $D_1$ represent a fractional part. Seven slices are operating together to form the sampling DAC. The fractional part represented by $D_3$, $D_2$, and $D_1$ can be set by the ratio in which the slices are set to integer values. For example, if the integer portion of the dither word is 2 and the fractional part is "101" or 5/7 then two of the slices would be set to "2" and five of the slices would be set to "3" when sampling the input word.

Thus, all of $D_6$ to $D_1$, namely the first dither value is used to dither the value sampled on to the sampling DAC 220. However, a selection of bits of the first dither value can be used to form a second dither value. Bits not selected to form the second dither value can be used to form a third dither value.

In the worked example shown in FIG. 19, bits $D_5$, $D_3$, $D_2$, and $D_1$ are used to form the second dither value which is used to dither the ADC part 200 of the stage. Thus, the dither comprises a fractional part of 1/7, 2/7, 3/7, 4/7, 5/7, or 6/7 plus an integer part which is either 0 or 2.

The third dither value comprises part of the first dither value, namely $D_4$ which represents either 1 or zero and $D_6$ which represents 4 or zero. Thus in this example a value of 0, 1, 4, or 5 depending on the value of the first dither value, is subtracted from the digital output of the ADC part 200 before being used to set the sampling residue DAC 220.

This leaves some residual dither, $D_5$, $D_3$, $D_2$, and $D_1$, which manifests itself as an analog dither at the output of the sampling DAC 220 when it forms the analog residue signal. In order to address this, the digital value $D_5$, $D_3$, $D_2$, and $D_1$ is passed to a subsequent stage such that it can be subtracted from the digital value formed by the subsequent stage.

Figure 20:
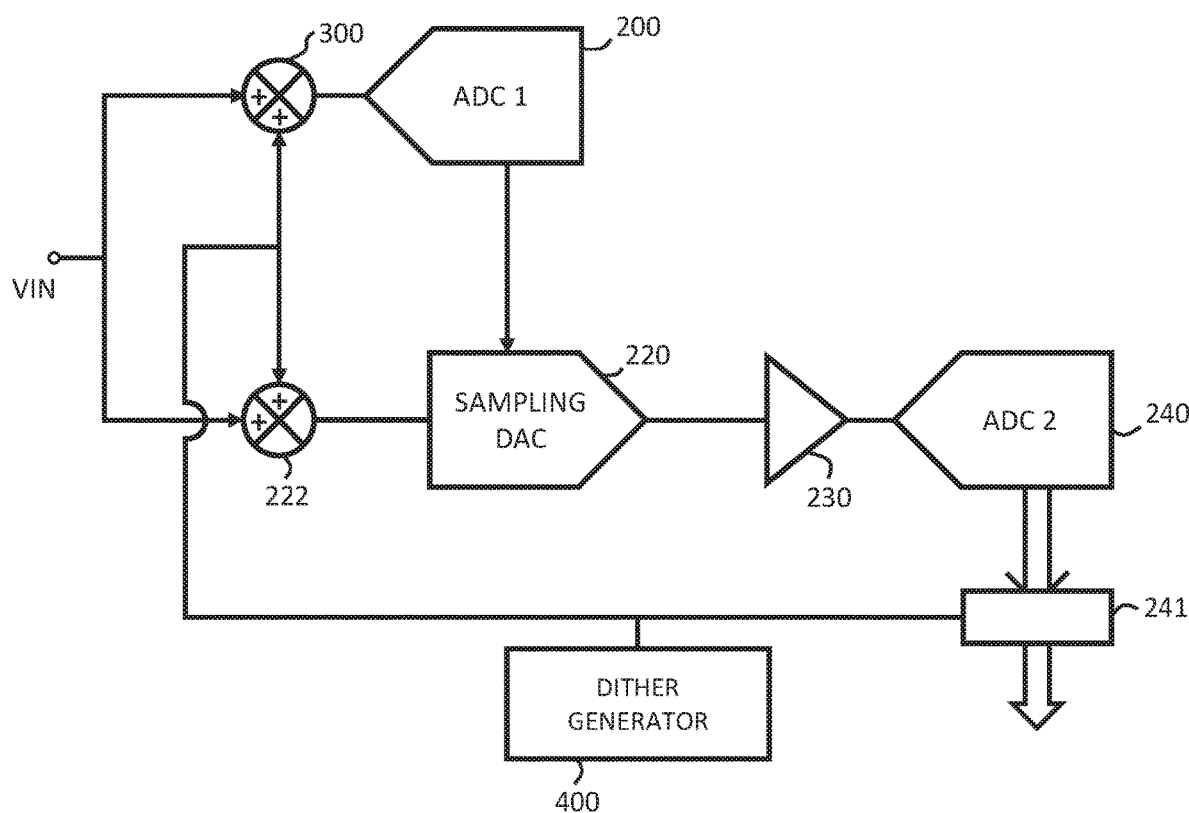
FIG. 20 is a schematic diagram of a further embodiment of this disclosure.

In a further variation as shown in FIG. 20, no dither correction is applied to the digital word output from the first ADC part 200 in the first stage, i.e., summer/subtractor 224 is omitted, and all of the dither value is passed to a subsequent stage comprising a second ADC 240 which converts the residue and dither output by the sampling DAC 220, and the digital value of the dither is removed from the output of the second ADC 240 by a subtractor 241. In a variant, summer 222 maybe omitted such that the sampling DAC does not sample the dither, or equivalently the first dither value is not supplied to the sampling DAC 220 to dither the analog input signal that it samples.

The outputs (as corrected for dither) of ADC1 and ADC2 are concentrated so that the ADC1 provides a word representing the most significant bits of the conversion result and ADC2 outputs a word representing the least significant bits of the conversion result. This is also the case for the earlier examples disclosed herein.

The examples herein have been discussed in terms of a plurality of physical stages physically arranged in a pipeline. If speed is not so important, but resolution is valued, then a stage may be reused to work on a residue value formed by the same physical stage in a preceding conversion step. Thus a stage is in a temporal rather than a physical pipeline.

It is thus possible to provide an improved method of applying and removing dither within an ADC. It is also possible to use slices, each of which may have its own dither applied, to further linearize to output of the ADC and also to allow a speed improvement to be obtained by the use of smaller capacitors within each slice while not sacrificing noise performance.

The claims have been presented in single dependency format, however it is to be understood that for the purposes of those jurisdictions that allow multiply dependent claiming, each claim can depend on any preceding claim of the same type, unless that is clearly technically infeasible.

The present disclosure encompasses apparatuses which can perform the various methods described herein. Such apparatuses can include circuitry illustrated by the Figures and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on one or more non-transitory computer media.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the Figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the Figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the Figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

EXAMPLES

The examples have been presented to refer to a single example, however it is to be understood that the examples can incorporate one or more other examples of the same type (referencing the other example(s) together or in the alternative), unless that is clearly technically infeasible.

Example 1 is a method of operating a residue forming stage of an analog to digital converter, the residue forming stage comprising an analog to digital converter and at least a first sampling digital to analog converter, and the analog to digital converter of the residue forming stage has a least significant bit value, the method comprising receiving an input signal and adding a first dither value to the input signal to form a dithered input signal sampled by the first sampling digital to analog converter but the first dither value is not added to the input signal provided to the analog to digital converter of the stage, using the analog to digital converter of the stage to form a digital code; modifying the digital code by a digital value related to at least part of the first dither value to form a modified digital code, and providing the modified digital code to the at least first sampling digital to analog converter.

In Example 2, the method of Example 1 can further include in which the first dither value is combined with the sampled value within the first sampling digital to analog converter by setting elements of the first sampling digital to analog converter to a non-zero code state during acquisition of the input signal onto the first sampling digital to analog converter.

In Example 3, the method of Example 1 can further include in which the first sampling digital to analog converter comprises a plurality of sampling digital to analog converter slices, and the first dither value is distributed to at least one of the digital to analog converter slices.

In Example 4, the method of Example 1 can further include in which the first sampling digital to analog converter comprises a plurality of sampling digital to analog converter slices, and at least one further dither value is combined with the input signal such that respective dithered input signals are formed by at least two of the digital to analog converter slices.

In Example 5, the method of Example 1 can further include forming a second dither value different from the first dither value, where the second dither value is used to modify the input signal converted by the analog to digital converter.

In Example 6, the method of Example 5 can further include where a second dither value is at least partly related to the first dither value.

In Example 7, the method of Example 6 can further include in which the second dither value comprises a fractional dither value less than one least significant bit of the stage.

In Example 8, the method of Example 7 can further include in which the second dither value further comprises an integer dither portion expressed as multiples of one least significant bit of the stage.

In Example 9, the method of Example 5 can further include in which the second dither value is not removed from a digital code output by the analog to digital converter of the stage, such that the second dither value becomes a dither value added to the residue formed by the first sampling digital to analog converter.

In Example 10, the method of Example 9 can further include in which the stage is followed by a subsequent analog to digital converter, and a digital output of the subsequent analog to digital converter is modified so as to remove a value related to the second dither value therefrom.

In Example 11, the method of Example 1 can further include in which the stage is followed by a subsequent analog to digital converter which processes the residue, and a digital output of the subsequent analog to digital converter is modified to remove a value related to at least part of the first dither therefrom.

In Example 12, the method of Example 5 can further include where the dither value comprises n bits and the second dither value comprises m of the n bits and the digital value comprises the rest of the n bits.

Example 13 is a method of operating first and second stages of an analog to digital converter where the first stage forms a residue which is digitized by the second stage, the first stage comprising a first stage analog to digital converter and at least a first sampling digital to analog converter, the method comprising receiving a dither value, applying the dither value to the first stage analog to digital converter, using the first stage analog to digital converter to form a digital code, applying the digital code either directly or in a modified form to the at least one sampling digital to analog converter such that the sampling digital to converter outputs an analog residue value, passing the analog residue value to the second stage, converting the analog residue value into a digital result, and correcting the digital result for the dither value.

In Example 14, the method of Example 13 can further include in which the dither value is applied to an input signal sampled by the at least one sampling digital to analog converter.

Example 15 is a stage of an ADC, comprising a stage ADC, a DAC, and a dither generator for generating a first dither, wherein the stage ADC is arranged to receive an analog input signal and to form a digital conversion value representing the analog input signal, and the DAC is arranged to sample a combination of the analog input signal and the first dither, and the DAC is further arranged to receive a digital conversion value from which the value of the first dither has been subtracted and to form an analog residue representing a difference between the digital conversion value and the analog input signal.

In Example 16, the stage of Example 15 can further include in which the first dither is not supplied in its entirety to the stage ADC.

In Example 17, the stage of Example 15 can further include in which the DAC comprises at least one switched capacitor sampling DAC slice, and the dither is applied to the at least one slice by modifying switch states within the at least one switched capacitor sampling DAC slice in accordance with the first dither value during a sampling phase so as to add the first dither to the sampled input signal.

Example 18 is a pipelined analog to digital converter comprising a stage of an ADC as claimed in claim 15, in combination with a succeeding stage, and the dither generator is further operable to form a second dither which comprises a fractional value of the least significant bit of the stage of the ADC, the second dither used to modify with the input signal to be converted by the stage of the ADC, the succeeding stage being arranged to form a second stage digital conversion value representing the residue or an amplified version of the residue, and the second dither value being provided to a subtractor to remove the second dither value from the second stage digital conversion value.

Example 19 is a method of operating a pipelined ADC, the method comprising applying a dither to a residue formed by an Nth stage of the ADC, such that the dither modifies an input signal to an N+1th stage of the ADC, where N is an integer number greater than zero and a digital value of the dither is passed to the N+1th stage of the ADC such that the value of the dither can be removed from the output result of the N+1th stage.

Example 20 is a digital to analog converter comprising first and second stages arranged in a pipeline, wherein the first stage forms a residue and a dither value is added to the residue so as to introduce a dither into the second stage.

What is claimed is:

1. A method of operating a residue forming stage of an analog to digital converter, the residue forming stage comprising an analog to digital converter and a first sampling digital to analog converter, and the analog to digital converter of the residue forming stage has a least significant bit value, the method comprising:
    receiving an input signal,
    adding a first dither value to the input signal to form a dithered input signal sampled by the first sampling digital to analog converter but the first dither value is not added to the input signal provided to the analog to digital converter of the residue forming stage,
    using the analog to digital converter of the residue forming stage to form a digital code,
    modifying the digital code by a digital value related to at least part of the first dither value to form a modified digital code, and
    providing the modified digital code to the first sampling digital to analog converter.

2. The method of claim 1, wherein the first dither value is combined with a sampled value within the first sampling digital to analog converter by setting elements of the first sampling digital to analog converter to a non-zero code state during acquisition of the input signal onto the first sampling digital to analog converter.

3. The method of claim 1, wherein the first sampling digital to analog converter comprises a plurality of sampling digital to analog converter slices, and the first dither value is distributed to at least one of the sampling digital to analog converter slices.

4. The method of claim 1, wherein the first sampling digital to analog converter comprises a plurality of sampling digital to analog converter slices, and at least one further dither value is combined with the input signal such that respective dithered input signals are formed by at least two of the sampling digital to analog converter slices.

5. The method of claim 1 further comprising forming a second dither value different from the first dither value, wherein the second dither value is used to modify the input signal converted by the analog to digital converter.

6. The method of claim 5, wherein the second dither value is at least partly related to the first dither value.

7. The method of claim 6, wherein the second dither value comprises a fractional dither value less than one least significant bit of the residue forming stage.

8. The method of claim 7, wherein the second dither value further comprises an integer dither portion expressed as multiples of one least significant bit of the residue forming stage.

9. The method of claim 5, wherein the second dither value is not removed from a digital code output by the analog to digital converter of the residue forming stage, such that the second dither value becomes a dither value added to the residue formed by the first sampling digital to analog converter.

10. The method of claim 9, wherein the residue forming stage is followed by a subsequent analog to digital converter, and a digital output of the subsequent analog to digital converter is modified so as to remove a value related to the second dither value therefrom.

11. The method of claim 1, wherein the residue forming stage is followed by a subsequent analog to digital converter which processes the residue, and a digital output of the subsequent analog to digital converter is modified to remove a value related to at least part of the first dither value therefrom.

12. The method of claim 5, wherein the first dither value comprises n bits and the second dither value comprises m of the n bits and the digital value comprises the rest of the n bits.

13. A method of operating first and second stages of an analog to digital converter where the first stage forms a residue which is digitized by the second stage, the first stage comprising a first stage analog to digital converter and at least one sampling digital to analog converter, the method comprising:
   receiving a dither value,
   applying the dither value to the first stage analog to digital converter,
   using the first stage analog to digital converter to form a digital code,
   applying the digital code either directly or in a modified form to the at least one sampling digital to analog converter such that the sampling digital to converter outputs an analog residue value, and
   passing the analog residue value to the second stage.

14. The method of claim 13, further comprising:
   converting the analog residue value into a digital result, and
   correcting the digital result for the dither value.

15. The method of claim 13, wherein the dither value is applied to an input signal sampled by the at least one sampling digital to analog converter.

16. An analog to digital converter (ADC), comprising:
   a stage ADC,
   a digital to analog converter (DAC), and
   a dither generator for generating a first dither,
   wherein:
      the stage ADC is arranged to receive an analog input signal and to form a digital conversion value representing the analog input signal,
      the DAC is arranged to sample a combination of the analog input signal and the first dither, and
      the DAC is further arranged to receive a digital conversion value from which a value of the first dither has been subtracted and to form an analog residue representing a difference between the digital conversion value and the analog input signal.

17. The ADC of claim 16, wherein the first dither is not supplied in its entirety to the stage ADC.

18. The ADC of claim 16, further comprising:
   a succeeding stage,
   wherein:
      the dither generator is further operable to form a second dither which comprises a fractional value of a least significant bit of the stage ADC, and
      the second dither is used to modify with the analog input signal to be converted by the stage ADC.

19. The ADC of claim 18, wherein:
   the succeeding stage is arranged to form a second stage digital conversion value representing the analog residue or an amplified version of the analog residue, and
   a value of the second dither is provided to a subtractor to remove the value of the second dither from the second stage digital conversion value.

20. The ADC of claim 16, wherein:
   the DAC comprises at least one switched capacitor sampling DAC slice, and
   the value of the first dither is applied to the at least one switched capacitor DAC slice by modifying switch states within the at least one switched capacitor sampling DAC slice in accordance with the value of the first dither during a sampling phase so as to add the value of the first dither to a sampled input signal within the at least one switched capacitor sampling DAC slice.

21. A method of operating a pipelined analog to digital converter (ADC), the method comprising:
   applying a dither to a residue formed by an Nth stage of the ADC by modifying a signal applied to a sampling digital to analog converter in the Nth stage in response to a digital value of the dither, during sampling of an input signal to the Nth stage, wherein:
      the dither is introduced to an input signal to an N−1th stage of the ADC, and
      N is an integer number greater than zero, and removing at least a portion of the dither in a stage subsequent to the Nth stage.

22. The method of claim 21, wherein removing the at least a portion of the dither comprises removing the at least a portion of the dither in a digital output of the stage subsequent to the Nth stage.

23. A pipelined analog to digital converter (ADC), comprising:
   a first stage to form a residue, wherein the first stage comprises a sampling digital to analog converter to sample an input signal of the first stage and add a dither value to the residue by modifying switch positions of capacitors in the sampling digital to analog converter in accordance with a digital representation of a dither value, and
   a second stage arranged in a pipeline with the first stage to receive and perform analog to digital conversion of the residue, wherein the second stage comprises a subtractor to remove the dither value in the second stage.

24. The pipelined ADC of claim 23, wherein the subtractor is a digital subtractor to remove a digital value of the dither.

* * * * *